US006717327B2

(12) United States Patent  
Kando et al.

(10) Patent No.: US 6,717,327 B2  
(45) Date of Patent: Apr. 6, 2004

(54) SURFACE ACOUSTIC WAVE DEVICE

(75) Inventors: Hajime Kando, Nagaokakyo (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/284,184

(22) Filed: Oct. 31, 2002

(65) Prior Publication Data

US 2003/0168930 A1 Sep. 11, 2003

Related U.S. Application Data

(63) Continuation-in-part of application No. 09/840,359, filed on Apr. 23, 2001.

(30) Foreign Application Priority Data

Oct. 31, 2001 (JP) ........................................ 2001-334296

(51) Int. Cl.[7] ................................................. H03H 9/15
(52) U.S. Cl. .................................................. 310/313 A
(58) Field of Search ........................ 310/313 A, 313 B, 310/313 D, 313 R, 340, 363; 333/193, 194

(56) References Cited

U.S. PATENT DOCUMENTS

| | | | | |
|---|---|---|---|---|
| 4,952,832 A | * | 8/1990 | Imai et al. .............. | 313/313 A |
| 5,329,208 A | | 7/1994 | Imai et al. | |
| 5,401,544 A | * | 3/1995 | Nakahata et al. .......... | 427/585 |
| 5,432,392 A | * | 7/1995 | Kadota et al. ........... | 310/313 A |
| 5,646,468 A | * | 7/1997 | Nakahata et al. ........ | 310/313 A |
| 5,888,646 A | * | 3/1999 | Takahashi et al. .......... | 428/336 |
| 6,121,713 A | * | 9/2000 | Inoue et al. ............ | 310/313 A |
| 6,218,763 B1 | * | 4/2001 | Fujimoto et al. ....... | 310/313 R |
| 6,310,424 B1 | * | 10/2001 | Ogura et al. ............ | 310/313 R |
| 6,310,425 B1 | * | 10/2001 | Tanaka ................... | 310/313 R |
| 6,369,491 B1 | * | 4/2002 | Nakagawa et al. ......... | 310/364 |
| 6,369,667 B1 | * | 4/2002 | Kadota et al. .............. | 333/133 |
| 2001/0035695 A1 | | 11/2001 | Kadota et al. | |

FOREIGN PATENT DOCUMENTS

JP      10-224172      8/1998

OTHER PUBLICATIONS

Michio Kadota, "SAW properties of ZN0 Film on ST–35X Quartz having an Excellent Temperature Coefficient and a Suitable Electromechanical Coupling Factor", The Japan Society for the Promotion of Science, the Surface Acoustic Wave Device Technique 150th Committee, the 59th data for study (1988), pp. 645–650.

Seiichi Mitobe, Masanori Koshiba, and Michio Suzuki; Finito–Element Analysis of Periodically Perturbed Piezoeletric Waveguides; Transactions of Institute of Electronics and Communication Engineers of Japan, vol. 168–C No. 1 (1985), pp. 21–27.

Michio Kadota, "Combination of ZnO Film and Quartz to Realize Large Coupling Factor and Excellent Temperature Coefficient for SAW Devices", 1997 IEEE Ultrasonics Symposium, pp. 261–266.

James J. Campbell and William R. Jones, "A Method for Estimating Optimal Crystal Cuts and Propagation Directions for Excitation of Piezoelectric Surface Waves", IEEE Transactions on Sonics and Ultrasonics, vol. SU–15, No. 4, Oct. 1968.

* cited by examiner

Primary Examiner—Thomas M. Dougherty  
Assistant Examiner—Karen Beth Addison  
(74) Attorney, Agent, or Firm—Keating & Bennett, LLP

(57) ABSTRACT

A surface acoustic wave device includes a piezoelectric thin film arranged on a quartz substrate, and the quartz substrate has Euler angles ($\phi$, $\theta$, $\psi$) which satisfy $-19° < \phi < +15°$, $107° < \theta < 125°$ and $-10° < \psi < 15°$. A piezoelectric thin film is disposed on the quartz substrate, and comb electrodes are arranged so as to contact the piezoelectric thin film, wherein the normalized thickness $H/\lambda$ of the piezoelectric thin film is at least about 0.05 where the thickness of the piezoelectric thin film is H, and the wavelength of the surface acoustic wave is $\lambda$.

13 Claims, 31 Drawing Sheets

SURFACE ACOUSTIC WAVE DEVICE

This is a Continuation-in-Part of U.S. patent application Ser. No. 09/840,359, filed on Apr. 23, 2001, currently pending.

BACKGROUND OF THE INVENTION

1. Field of the Invention

The present invention relates to a surface acoustic wave device using a quartz substrate, and more particularly relates to a greatly improved a surface acoustic wave device using a surface acoustic wave substrate that is formed by laminating a piezoelectric thin film on a quartz substrate.

2. Description of the Related Art

In the past, surface acoustic wave devices have been widely used, for example, for bandpass filters of mobile communication devices. A surface acoustic wave (hereafter "SAW") device has a structure in which at least one interdigital transducer (hereafter "IDT") composed of at least one pair of comb electrodes is formed so as to contact the piezoelectric body.

Furthermore, various types of SAW devices using a piezoelectric thin film have also been proposed in recent years. Specifically, SAW devices using a surface acoustic wave substrate composed of a piezoelectric thin film formed on an elastic substrate such as a glass substrate and a piezoelectric substrate have been proposed.

The four types of structures shown in FIGS. 22(a), 22(b) and 23(a), and 23(b) are known as structures using a surface acoustic wave substrate formed by laminating the above-mentioned piezoelectric thin film and elastic substrate. Specifically, in the SAW device 101 shown in FIG. 22(a), a piezoelectric thin film 103 is formed on an elastic substrate 102, and IDTs 104 are formed on the piezoelectric thin film 103, while in the SAW device 105 shown in FIG. 22(b), the IDTs 104 are formed on the lower surface of the piezoelectric thin film 103, i.e., in the interface between the elastic substrate 102 and the piezoelectric thin film 103.

Furthermore, in the SAW device 106 shown in FIG. 23(a), a short-circuiting electrode 107 is formed on the elastic substrate 102, and the piezoelectric thin film 103 is laminated on top of this short-circuiting electrode 107. The IDTs 104 are formed on the piezoelectric thin film 103. In other words, the structure of the SAW device 106 corresponds to the structure of the SAW device 101 shown in FIG. 22(a) with the short-circuiting electrode 107 inserted in the interface between the elastic substrate 102 and the piezoelectric thin film 103.

In the SAW device 108 shown in FIG. 23(b), the short-circuiting electrode 107 is formed on the piezoelectric thin film 103. Furthermore, the IDTs 104 are formed in the interface between the elastic substrate 102 and the piezoelectric thin film 103. Therefore, the structure of the SAW device 108 corresponds to the structure of the SAW device 105 shown in FIG. 22(b) with the short-circuiting electrode 107 formed on the upper surface of the piezoelectric thin film 103.

FIG. 24 shows the electromechanical coupling coefficients of the above-mentioned SAW devices 101, 105, 106, and 108 in a case where the structures of these devices are only differentiated by the formation position of the IDTs 104 and the presence or absence of the short-circuiting electrode 107, and other structures are kept the same, with a ZnO thin film used as the piezoelectric thin film, and a glass substrate used as the elastic substrate.

FIG. 24 illustrates changes in electromechanical coupling coefficients with respect to the normalized thickness $H/\lambda$ of the ZnO thin film in the above-mentioned four types of SAW devices. In the present specification, H indicates the thickness of the piezoelectric thin film, and $\lambda$ indicates the wavelength of the surface acoustic wave to be excited (units are the same in both cases).

Furthermore, the solid line A indicates the results for the SAW device 101, the broken line B indicates the results for the SAW device 105, the one-dot chain line C indicates the results for the SAW device 106, and the two-dot chain line D indicates the results for the SAW device 108.

As is clearly seen from FIG. 24, larger electromechanical coupling coefficients can be obtained with the SAW devices 105 and 108 than with the SAW devices 101 and 106 by selecting $H/\lambda$.

Accordingly, it has conventionally been thought that larger electromechanical coupling coefficients can be obtained when the IDTs 104 are formed in the interface between the glass substrate 102 and the ZnO thin film 103 in a structure in which the ZnO thin film 103 is formed on the glass substrate 102. Furthermore, the waves indicated as Sezawa waves in FIG. 24 are a higher-order mode of surface acoustic waves of the Rayleigh type.

In addition, various characteristics of the surface acoustic wave in the case of using a surface acoustic wave substrate in which a ZnO thin film is formed on a quartz substrate are described by the present inventors in IEEE ULTRASONICS SYMPOSIUM (1997), pp. 261–266 and in the research data from the 59th Acoustic Wave Device Technology No. 150 Committee Meeting (1998) of Japan Society for the Promotion of Science, pp. 23–28 (hereinafter referred to as "Reference 1"). These characteristics are described with reference to FIGS. 25(a), 25(b), and 26. In this prior art, it is theoretically and experimentally confirmed that a surface acoustic wave substrate with the temperature coefficient of frequency (TCF) of zero can be obtained by forming a ZnO thin film that has a negative value of the TCF on a quartz substrate with a cut angle and propagation direction which are such that the TCF has a positive value.

Furthermore, the theory in this Reference 1 is based on IEEE Trans. Sonics & Ultrasonic. Vol. SU-15, No. 4 (1968), page 209.

FIG. 25(a) shows the ZnO film thickness dependence of the TCF of the SAW device shown in FIG. 22(a) using the quartz substrate described in Reference 1 mentioned above, which is made of a 29°45' rotated Y-cut 35° X propagating plate, and which has the Euler angles of (0°, 119°45', 35°). FIG. 25(b) shows the ZnO film thickness dependence of the TCF of the SAW device shown in FIG. 22(a) using the quartz substrate described in Reference 1 mentioned above, which is made of a 42°45' rotated Y-cut 35° X propagating plate, and which has the Euler angles of (0°, 132°45', 35°). Furthermore, FIG. 26 shows the electromechanical coupling coefficients of the Rayleigh waves and the Sezawa waves constituting the spurious waves of the SAW devices that use a ZnO thin film as the piezoelectric thin film and a quartz substrate as the elastic substrate. The solid lines A through C in FIG. 26 indicate the electromechanical coupling coefficients of the Rayleigh waves in the SAW device structures shown in FIGS. 22(a), 22(b), and 23(a), respectively, while the broken lines A", C", D" indicate the changes in the electromechanical coupling coefficients of the Sezawa waves constituting the spurious waves in the SAW devices having the structures shown in FIGS. 22(a), 23(a), and 23(b), respectively.

It is seen from FIGS. 25(a) and 25(b) that the TCF becomes zero by selecting the normalized thickness of the ZnO film in the SAW device of FIG. 22(a).

Table 1 below shows the comparison between the SAW device of FIG. 22(a) (Al/ZnO/quartz laminated structure), which is described in the above-mentioned prior art, and a conventionally known SAW device having a favorable TCF.

TABLE 1

| Substrate | Euler Angles of Substrate | Acoustic Velocity (m/s) | $K^2$ (%) | Frequency-Temperature Deviation at −20 to 80° C. (ppm/° C.) |
|---|---|---|---|---|
| Al/ST-X quartz | (0°, 132° 45', 0°) | 3158 | 0.14 | 0.9 |
| Al/ $La_3Ga_5SiO_{14}$ | (0°, 143°, 24°) | 2756 | 0.42 | 1.63 |
| Al/$Li_2B_4O_7$ | (110°, 90°, 90°) | 3480 | 1 | 6.8 |
| Al/ZnO/ quartz | (0°, 119°45', 35°) (0°, 132°45', 35°) | 2900 | 1.0– 1.1 | 1.1 |

It is seen from FIG. 26 and Table 1 that with the SAW device of FIG. 22(a), approximately 1% of the electromechanical coupling coefficient $K^2$ is obtained, which is larger than in the case of the ST-X quartz substrate or $La_3Ga_5SiO_{14}$ substrate, and the acoustic velocity is lower by about 20% than in the case of the $Li_2B_4O_7$ substrate, which has a comparable electromechanical coupling coefficient $K^2$. This means that when a transversal-type SAW filter is constructed using the SAW device of FIG. 22(a), loss is lower than in the case of the ST-X quartz substrate or $La_3Ga_5SiO_{14}$ substrate, and this SAW filter is more compact and has a lower frequency deviation caused by the temperature than in the case of the $Li_2B_4O_7$ substrate.

Incidentally, it is indicated in FIG. 26 that when a ZnO thin film is used as the piezoelectric thin film, and a quartz substrate is used as the elastic substrate, the electromechanical coupling coefficient of the Rayleigh wave in the SAW device of the FIG. 22(b) is smaller than the electromechanical coupling coefficient of the Rayleigh waves in the SAW devices of FIGS. 22(a) and 23(a). This tendency is opposite of the tendency seen in cases where a glass substrate is used as the elastic substrate.

Thus, because the SAW devices of FIGS. 22(a) and 23(a) possess both a favorable TCF and a large electromechanical coupling coefficient, use of a device such as these makes it possible to enhance the performance of a bandpass filter and other surface acoustic wave devices used in a mobile communication device.

However, the problem is that even with the SAW devices of FIGS. 22(a) and 23(a), the electromechanical coupling coefficient is still not enough to sufficiently satisfy characteristics required for surface acoustic wave devices. Mobile communication systems have been shifting from the conventional analog system to the digital system, and to the code diffusion system. In an intermediate-frequency filter used in a digital system or a code diffusion system, for example, a low group delay deviation and low insertion loss are demanded. Transversal-type filters are known as bandpass filters using surface acoustic wave devices having a small group delay deviation. When a transversal-type filter is constructed using a conventional surface acoustic wave substrate, however, the electromechanical coupling coefficient is insufficient, so that the above-mentioned demands cannot be met.

SUMMARY OF THE INVENTION

In order to overcome the problems described above, preferred embodiments of the present invention provide a SAW device which uses a surface acoustic wave substrate formed by laminating a quartz substrate and a piezoelectric thin film, and which has low spurious response, superior temperature characteristics, and a very large electromechanical coupling coefficient.

According to a preferred embodiment of the present application, a surface acoustic wave device includes a quartz substrate in which the Euler angles ($\phi$, $\theta$, $\psi$) are such that $-19°<\phi<+15°$, $107°<\theta<125°$, and $-10°<\psi<15°$, a piezoelectric thin film disposed on the quartz substrate, and comb electrodes arranged so as to contact the piezoelectric thin film, wherein the normalized thickness H/$\lambda$ of the piezoelectric thin film is at least about 0.05 where the thickness of the piezoelectric thin film is H, and the wavelength of the surface acoustic wave is $\lambda$.

Preferably, the quartz substrate has the Euler angles ($\phi$, $\theta$, $\psi$) that are such that $\phi$ is in the range of about $-2.5°\pm5°$, $\theta$ is in the range of about $116°\pm5°$, and $\psi$ is in the range of about $+2.5°\pm5°$.

In a specific preferred embodiment of the present invention, the normalized thickness H/$\lambda$ of the piezoelectric thin film is at least about 0.20.

In another specific preferred embodiment of the present invention, the surface acoustic wave device is configured so that the piezoelectric thin film contacts at least one of the comb electrodes on the negative side of the piezoelectric thin film.

In yet another specific preferred embodiment of the present invention, a short-circuiting electrode is provided on the piezoelectric thin film.

In another specific preferred embodiment of the present invention, the Euler angles of the quartz substrate are such that the power flow angle (PFA) of the Rayleigh wave in FIG. 6 is in the range of about $\pm2.5°$.

In another specific preferred embodiment of the present invention, the Euler angles of the quartz substrate are such that the temperature coefficient of frequency (TCF) of the surface acoustic wave device in FIG. 7 is in the range of about $\pm25$ ppm/° C.

In another specific preferred embodiment of the present invention, the Euler angles of the quartz substrate are such that the temperature coefficient of frequency (TCF) of the surface acoustic wave device in FIG. 7 is in the range of about $\pm5$ ppm/° C.

In another specific preferred embodiment of the present invention, the Euler angles of the quartz substrate are such that the electromechanical coupling coefficient $K^2$ of the Rayleigh wave in FIG. 8 is about 0.8% or larger.

In another specific preferred embodiment of the present invention, the temperature coefficient of frequency (TCF) of the piezoelectric thin film has a negative value.

In another specific preferred embodiment of the present invention, the Euler angles of the quartz substrate are such that the difference of the power flow angles $\Delta$PFA between the surface acoustic wave to be utilized and unnecessary surface acoustic wave in FIG. 18 is in the range of about $\pm1°$.

In still another specific preferred embodiment of the present invention, $\phi$ of the Euler angles ($\phi$, $\theta$, $\psi$) of the quartz substrate is approximately −35 to +35°.

In preferred embodiments of the present invention, furthermore, a quartz substrate having the Euler angles that are crystallographically equivalent to the above-mentioned specific Euler angles of the quartz substrate may also be used.

In preferred embodiments of the present invention, the above-mentioned piezoelectric thin film is preferably formed from one type of material selected from the group consisting of ZnO, AlN, $Ta_2O_5$, and CdS.

The above and other features, elements, characteristics and advantages of the present invention will be clear from the following detailed description of the preferred embodiments of the invention in conjunction with the accompanying drawings.

DETAILED DESCRIPTION OF PREFERRED EMBODIMENTS

Figure 1A:
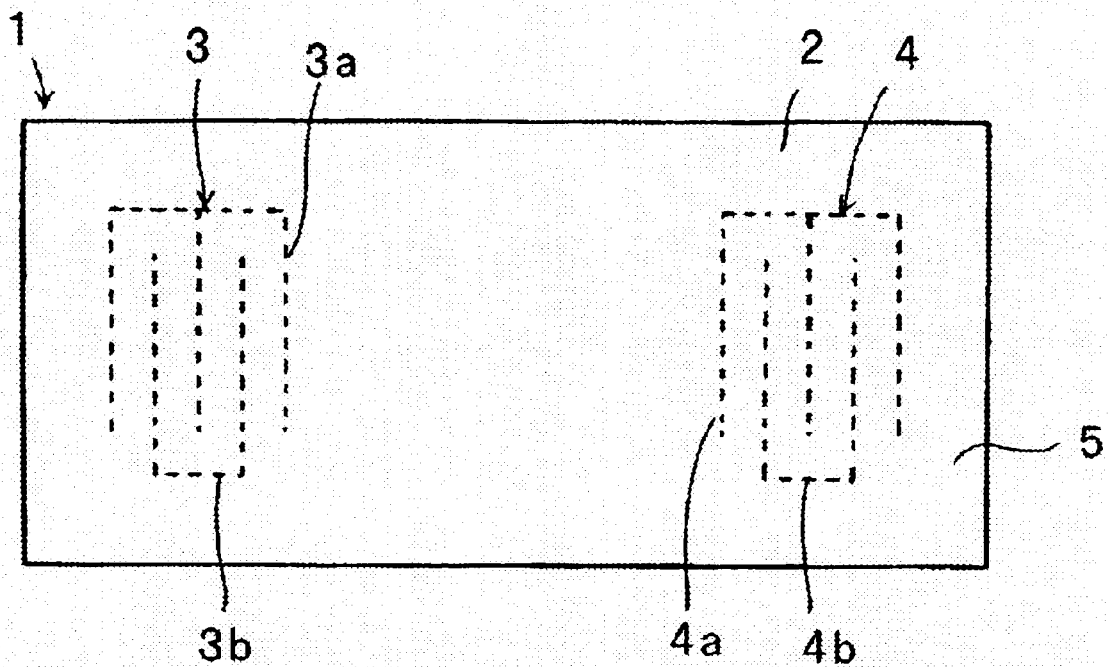
FIGS. 1(a) and 1(b) are simplified structural diagrams used to illustrate the surface acoustic wave device according to a preferred embodiment of the present invention, with FIG. 1(a) being a plan view and FIG. 1(b) being a sectional view of essential elements.
Figure 1B:
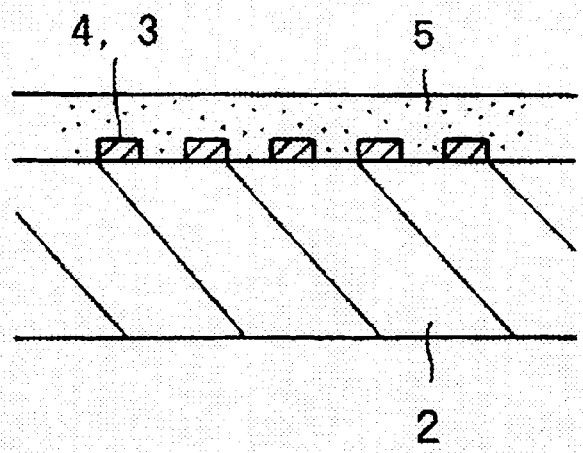

FIGS. 1(a) and 1(b) are a plan view of the surface acoustic wave device according to a preferred embodiment of the present invention, and a partially cutout sectional front view showing essential portions enlarged.

In a surface acoustic wave device 1, interdigital transducers (IDTs) 3 and 4 are disposed on a quartz substrate 2. The respective IDTs 3 and 4 have a pair of comb electrodes 3a, 3b, 4a, and 4b. The IDTs 3 and 4 are arranged with a specified distance in the surface acoustic wave propagation direction. Specifically, in the surface acoustic wave device 1 of the present preferred embodiment, the IDTs 3 and 4 are preferably configured in the same manner as in a universally known transversal-type surface acoustic wave filter.

One of the unique characteristics of the present preferred embodiment is that a piezoelectric thin film 5 is laminated so as to cover the IDTs 3 and 4, and the normalized thickness H/λ of the piezoelectric thin film 5 is at least about 0.05 where the thickness of this piezoelectric thin film 5 is H, and the wavelength of the surface acoustic wave is λ, thereby increasing the electromechanical coupling coefficient $K^2$ and improving the temperature characteristic. This is described in greater detail below.

Figure 22A:
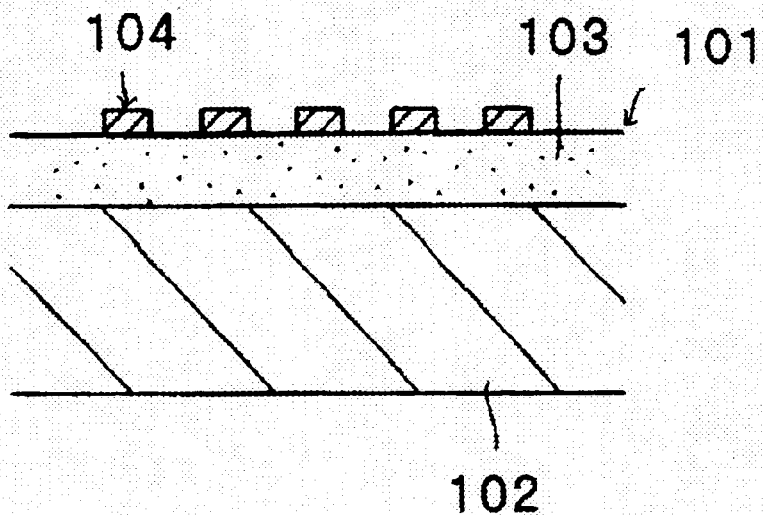
FIGS. 22(a) and 22(b) are model sectional views of a surface acoustic wave device that are used to illustrate examples of laminated structures of a substrate, piezoelectric thin film, and comb electrodes.
Figure 22B:
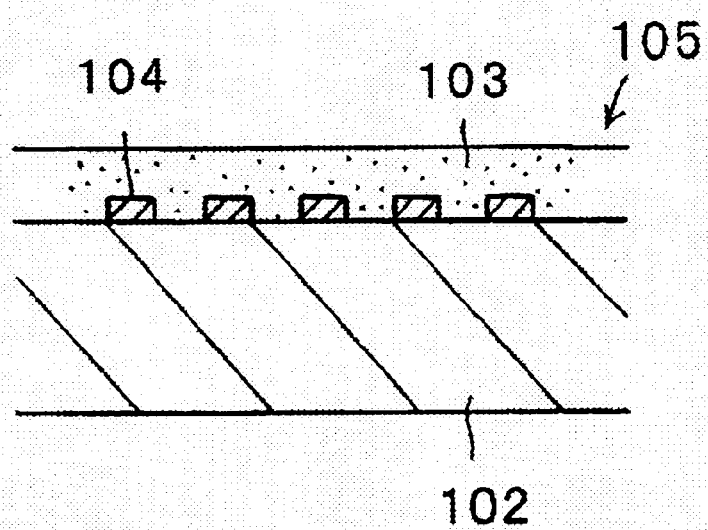
Figure 23A:
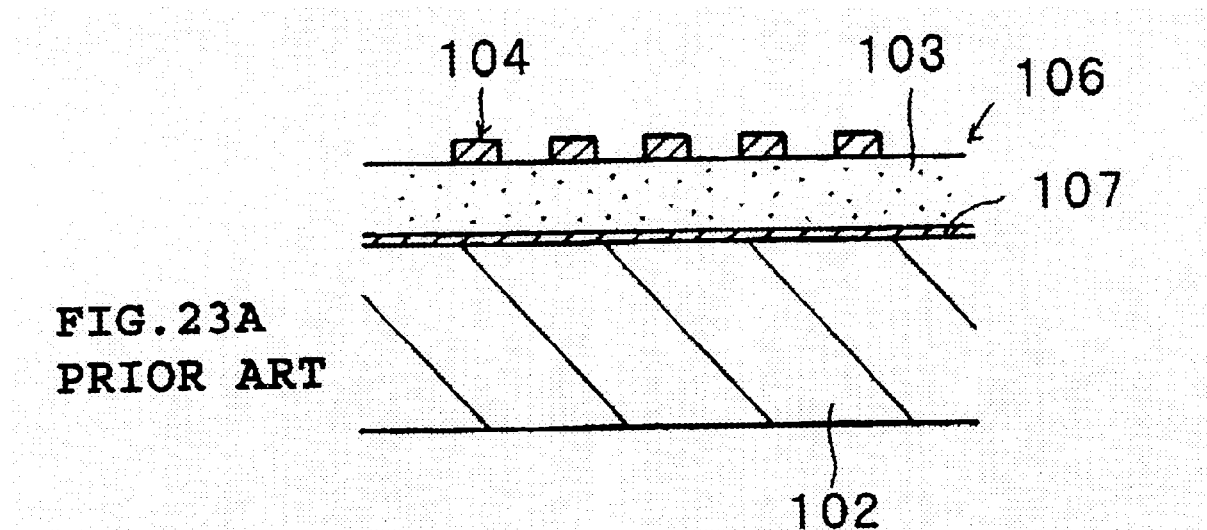
FIGS. 23(a) and 23(b) are model sectional views of a surface acoustic wave device that are used to illustrate examples of laminated structures of a substrate, piezoelectric thin film, and comb electrodes.
Figure 23B:
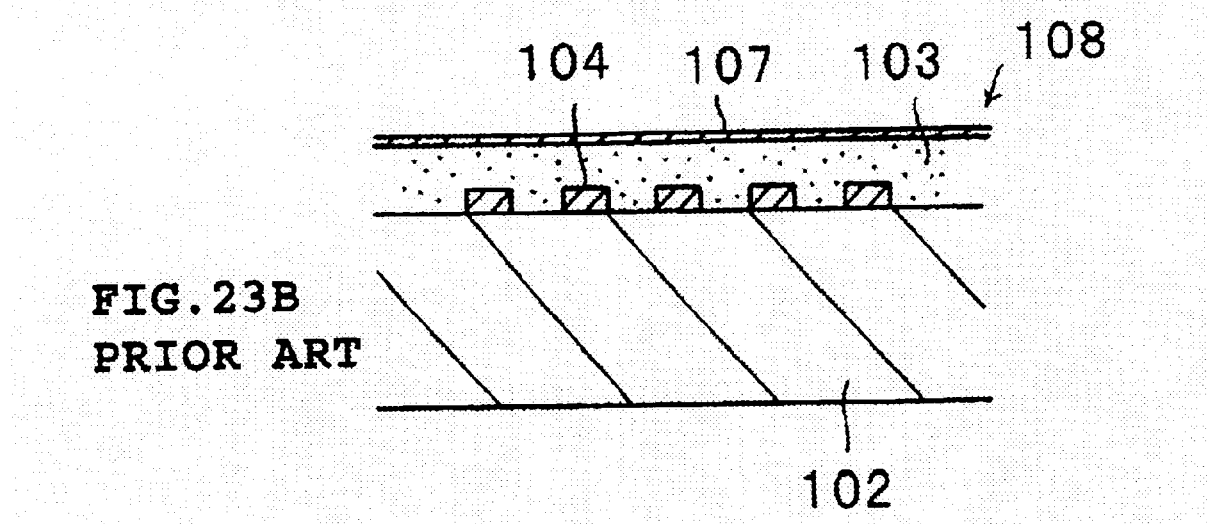

The inventors of the present application have investigated, from a different point of view and approach than that of the above-mentioned prior art, the characteristics of a surface acoustic wave device using a surface acoustic wave substrate formed by laminating a ZnO thin film (used as the piezoelectric thin film) on the surface of a quartz substrate (used as the elastic substrate), and especially the characteristics of a surface acoustic wave device that has the above-mentioned laminated structures shown in FIGS. 22(b) and 23(b), because of a suspicion on the part of the inventors that the tendency of this type of device is opposite of the tendency in cases where a glass substrate is used as the elastic substrate.

Figure 2:
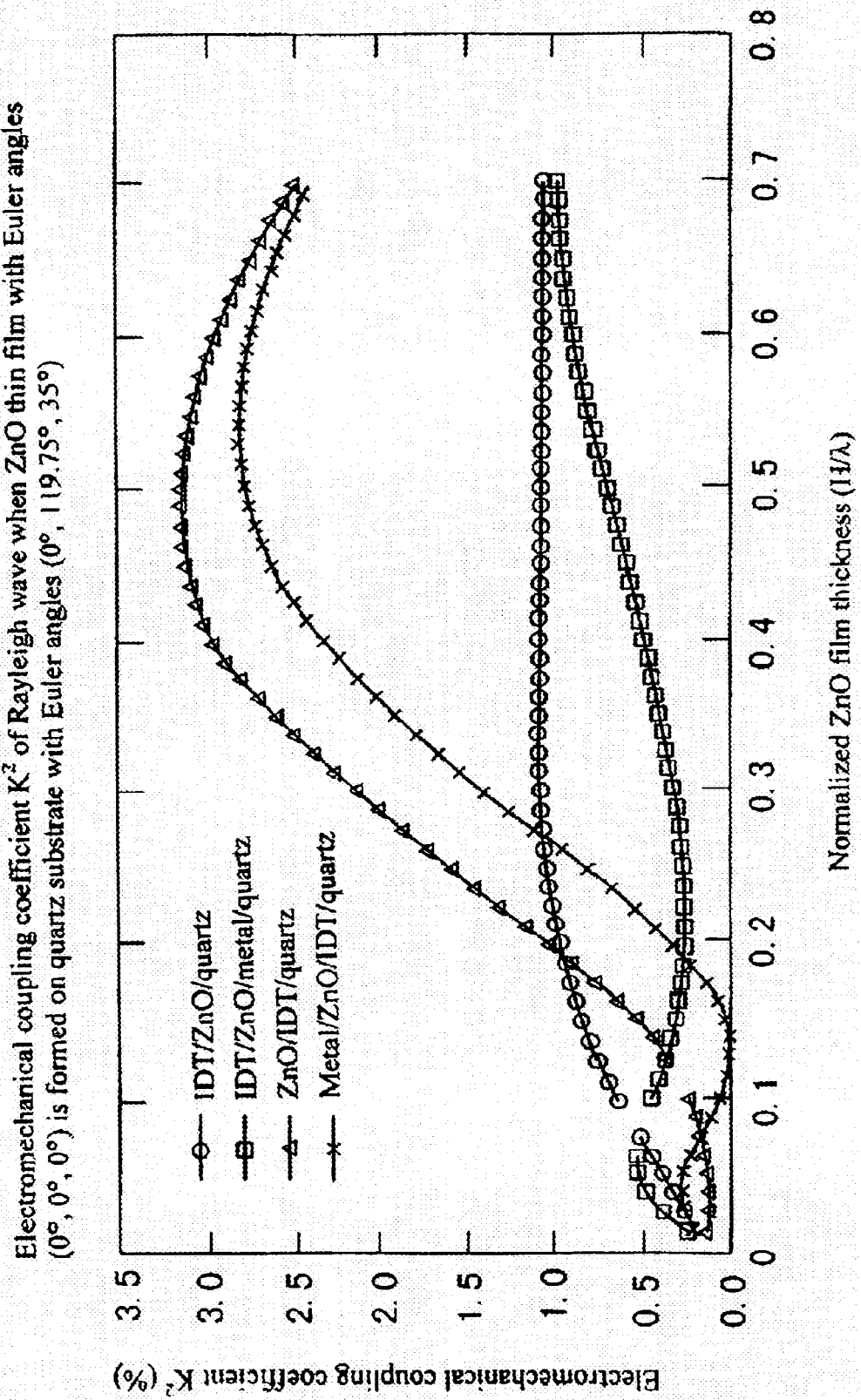
FIG. 2 is a graph showing the relationship between the electromechanical coupling coefficient $K^2$ and the normalized thickness of the ZnO film of the Rayleigh wave when a ZnO film having the Euler angles of (0°, 0°, 0°) is formed on a quartz substrate having the Euler angles of (0°, 119.75°, 35°) in SAW devices that have various types of laminated structures.
Figure 3:
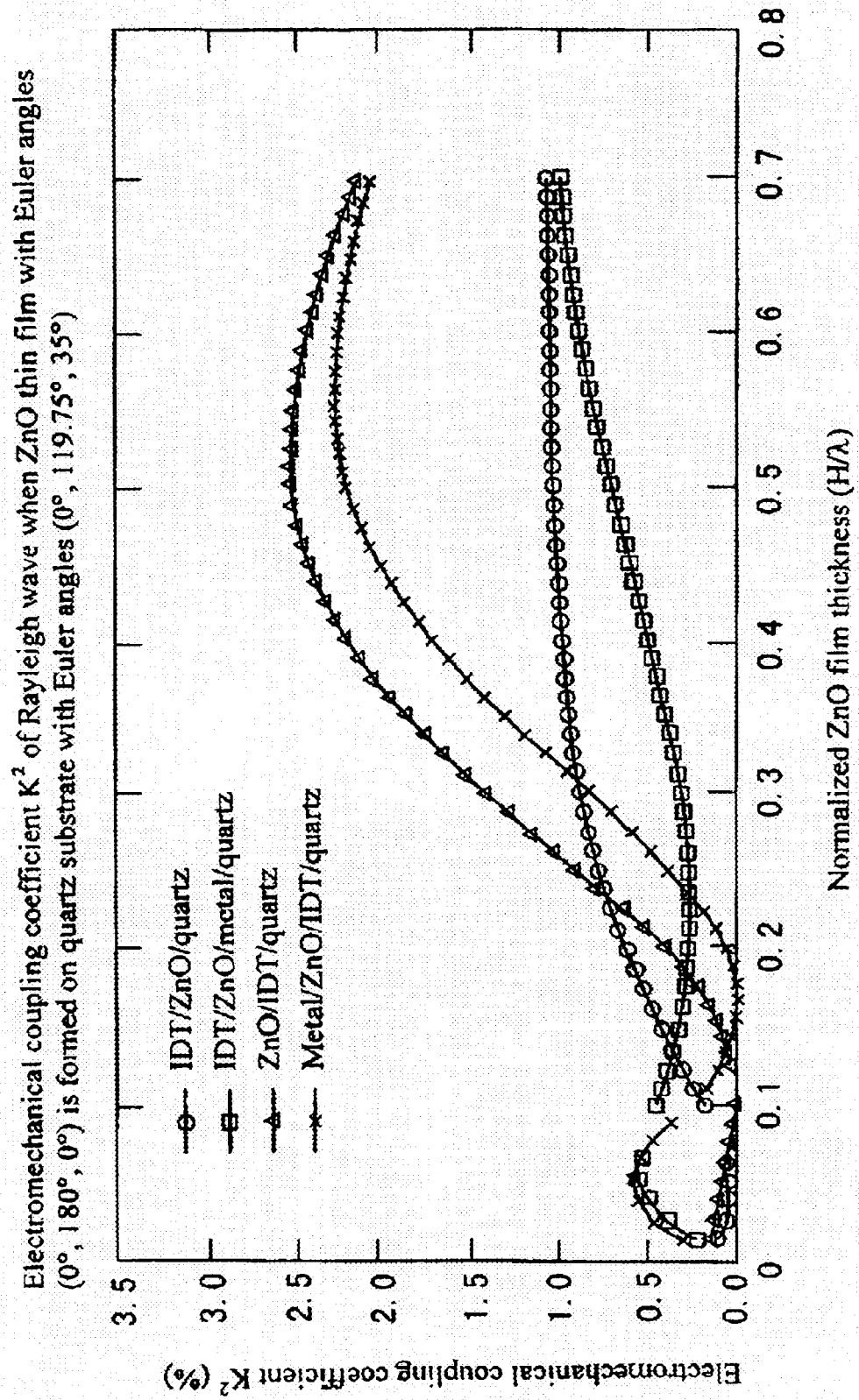
FIG. 3 is a graph showing the relationship between the electromechanical coupling coefficient $K^2$ of the Rayleigh wave and the normalized thickness of the ZnO film of the Rayleigh wave when a ZnO film having the Euler angles of (0°, 180°, 0°) is formed on a quartz substrate having the Euler angles of (0°, 119.75°, 35°) in SAW devices that have various types of laminated structures.
Figure 4:
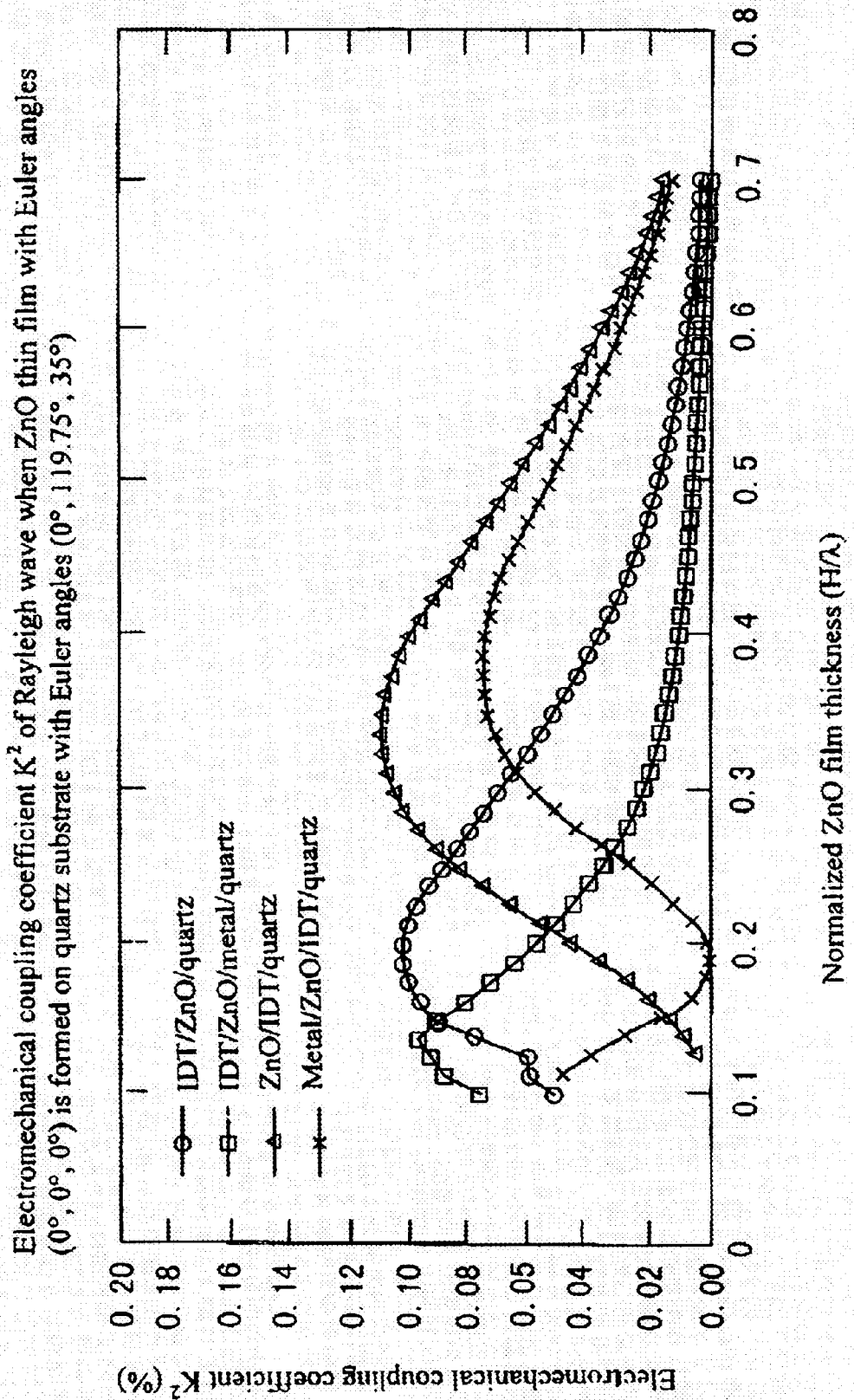
FIG. 4 is a graph showing the relationship between the electromechanical coupling coefficient $K_{sp}^2$ of the spurious wave and the normalized thickness of the ZnO film of the Rayleigh wave when a ZnO film having the Euler angles of (0°, 0°, 0°) is formed on a quartz substrate having the Euler angles of (0°, 119.75°, 35°) in SAW devices that have various laminated structures.
Figure 5:
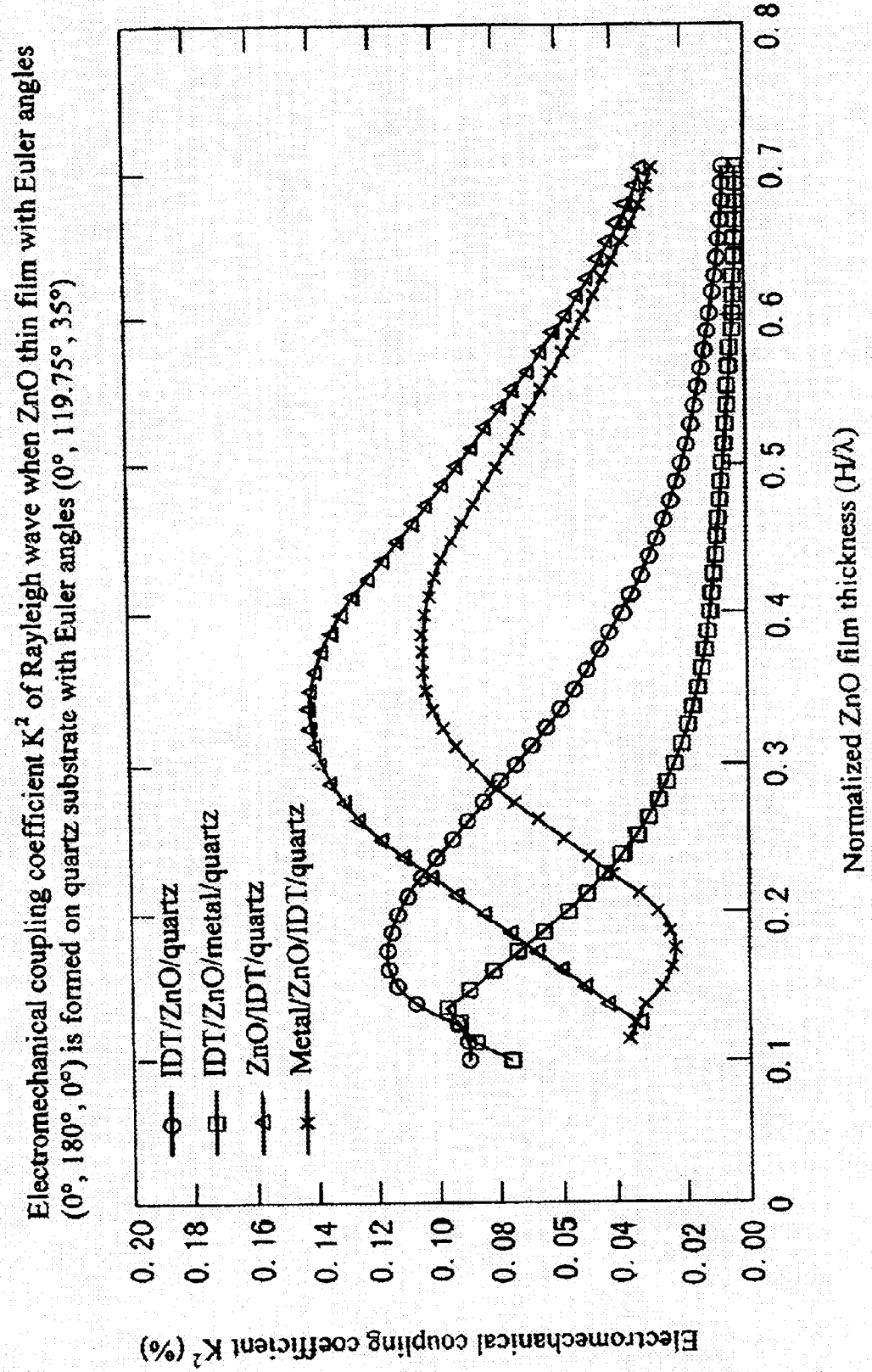
FIG. 5 is a graph showing the relationship between the electromechanical coupling coefficient $K_{sp}^2$ of the spurious wave and the normalized thickness of the ZnO film of the Rayleigh wave when a ZnO film having the Euler angles of (0°, 180°, 0°) is formed on a quartz substrate having the Euler angles of (0°, 119.75°, 35°) in SAW devices that have various laminated structures.

FIGS. 2 and 3 show the relationships between the electromechanical coupling coefficients and the normalized thickness of the ZnO thin film of the Rayleigh waves propagated through the respective SAW devices having the structures of FIGS. 22(a), 22(b), 23(a), and 23(b) in cases where an ZnO thin film is used as the piezoelectric thin film, and an X propagating quartz substrate with the Euler angles (0°, 119°45', 35°) is used as the elastic substrate. FIGS. 4 and 5 show the relationships between the electromechanical coupling coefficients and the normalized thickness of the ZnO thin film of the spurious waves generated in the vicinity of the Rayleigh waves.

Furthermore, in FIGS. 2 and 4, the Euler angles of the ZnO thin film are (0°, 0°, 0°), and in FIGS. 3 and 5, the Euler angles of the ZnO thin film are (0°, 180°, 0°), reversing the polarity of the ZnO thin film.

Here, the results in FIGS. 2 through 5 are obtained not by using the method of Cambell, et al., described in the above-mentioned prior art, but by using the finite element method proposed in the reference (IEICE transaction, Vol. 1, J68-C, No. 1 (1985) pp. 21–27), and the electromechanical coupling coefficients $K^2$ are determined by Equation (1) below, using the above-mentioned finite element method by deriving the acoustic velocity Vf of the free surface and the acoustic velocity Vm of the short-circuiting surface.

$$K^2=2\times(Vf-Vm)/Vf \qquad \text{Equation (1)}$$

In FIGS. 2 through 5, when the ZnO thin film thickness of the Rayleigh wave of the SAW device of FIG. 22(b) exceeds about 0.05λ, the electromechanical coupling coefficients $K^2$ become larger than in cases where the ZnO thin film is not formed.

Furthermore, when the above-mentioned ZnO thin film thickness exceeds the range of about 0.20λ to about 0.24λ, the electromechanical coupling coefficient $K^2$ of the Rayleigh wave of the SAW device of FIG. 22(b) becomes larger than the electromechanical coupling coefficients $K^2$ of the Rayleigh waves of the SAW devices of FIGS. 22(a), 23(a), and 23(b). In particular, when the ZnO thin film thickness is in the vicinity of about 0.5λ, the electromechanical coupling coefficient $K^2$ reaches three times the electromechanical coupling coefficient of the Rayleigh wave of the SAW device of FIG. 22(a).

Moreover, when the ZnO thin film thickness exceeds the range of about 0.27λ to about 0.31λ, the electromechanical coupling coefficient of the Rayleigh wave of the SAW device of FIG. 23(b) becomes larger than the electromechanical coupling coefficients of the Rayleigh waves of the SAW devices of FIGS. 22(a) and 23(a).

Figure 24:
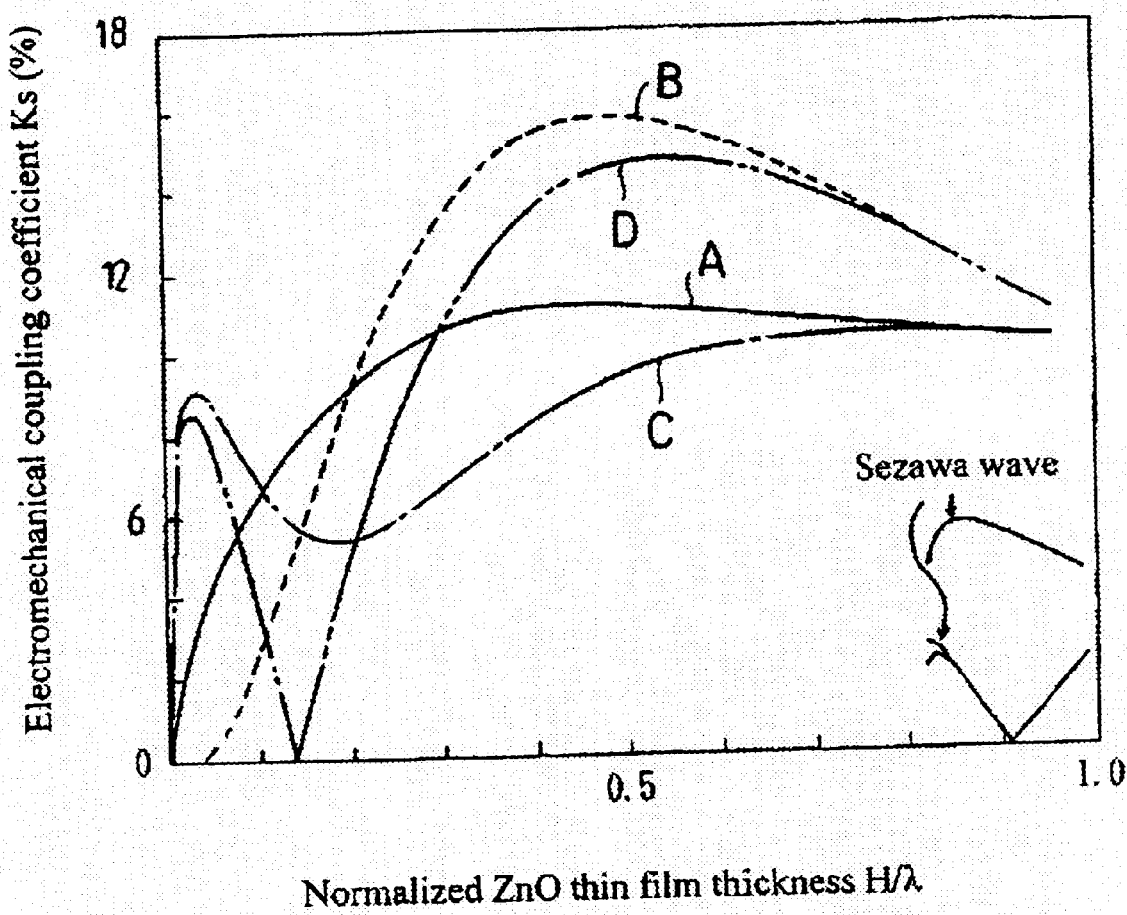
FIG. 24 is a graph showing the relationship between the normalized thickness of the ZnO thin film and the electromechanical coupling coefficient Ks in a conventional surface acoustic wave device.
Figure 25A:
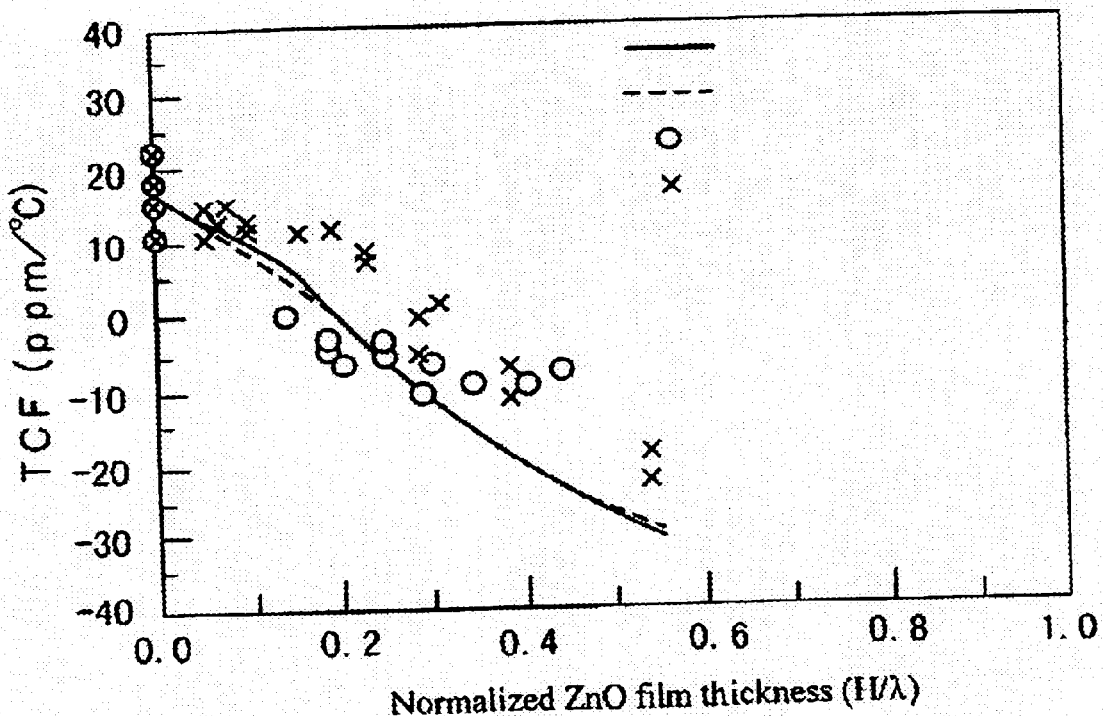
FIGS. 25(a) and 25(b) are graphs showing the dependence of the temperature coefficient of frequency (TCF) on the ZnO film thickness in a surface acoustic wave device described in a prior art.
Figure 25B:
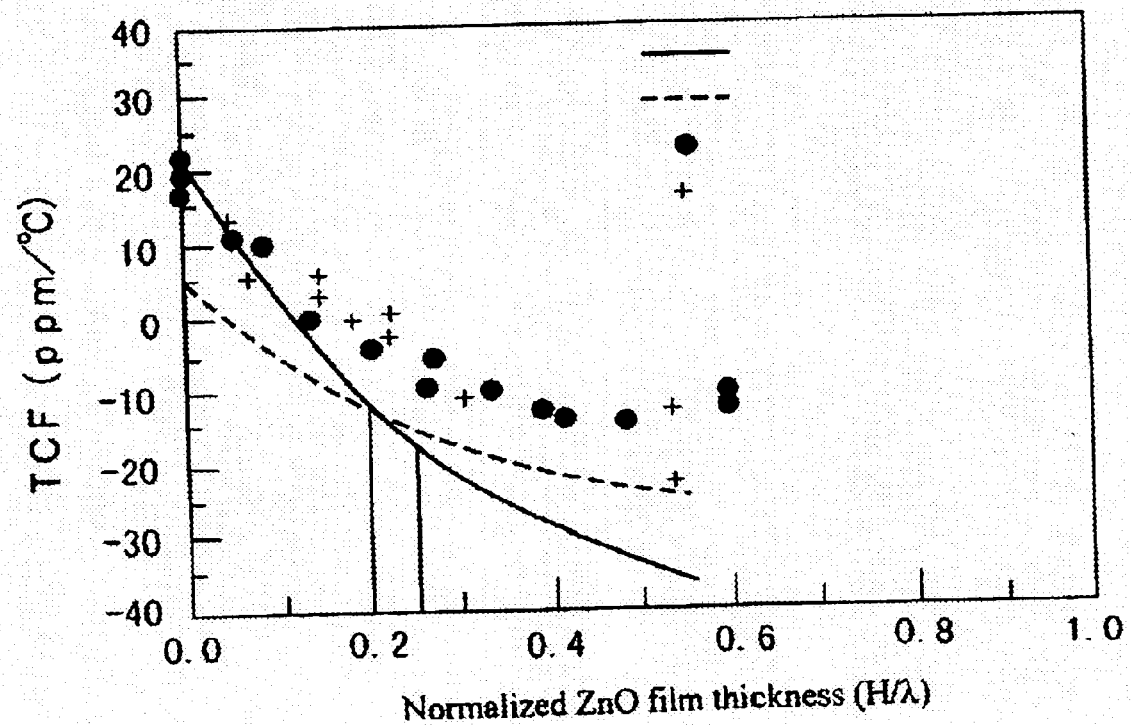
Figure 26:
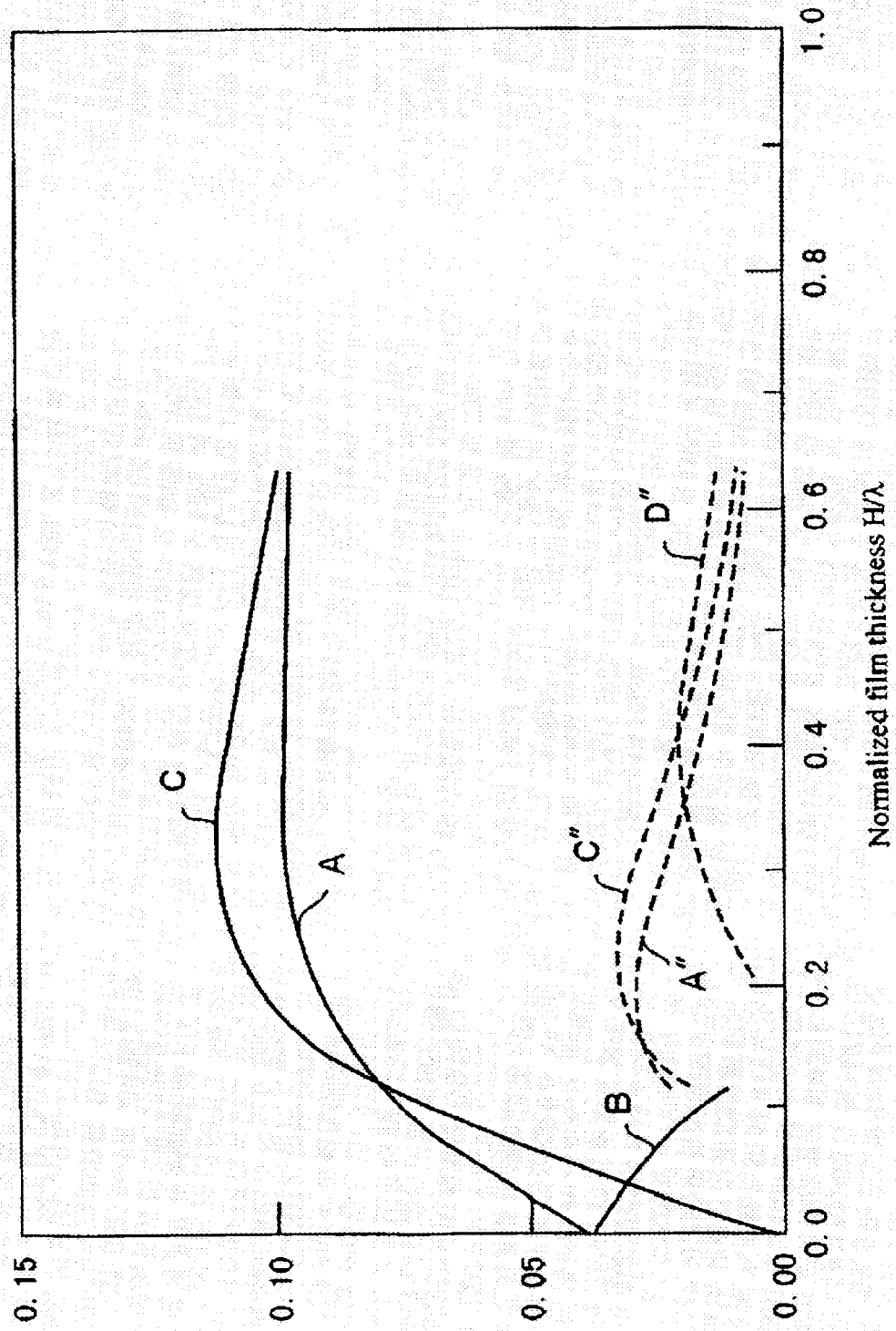
FIG. 26 is a graph showing the relationship between the normalized film thickness H/λ of ZnO and the electromechanical coupling coefficient described in a prior art.

The above-mentioned calculation results are similar to the results shown in FIG. 24 when a glass substrate is used as the elastic substrate, and show different tendency from that of the theoretical values in Reference 1 described above and shown in FIG. 25.

In addition, when the Euler angles of the ZnO thin film are (0°, 0°, 0°), the electromechanical coupling coefficients $K^2$ of the Rayleigh waves tend to be larger, and the electromechanical coupling coefficients $K^2$ of the spurious waves tend to be smaller, than when the Euler angles of the ZnO thin film are (0°, 180°, 0°).

It is seen from the calculations above that the electromechanical coupling coefficient $K^2$ can be greatly increased by using a surface acoustic wave substrate composed of a ZnO thin film formed on a quartz substrate with a SAW device having the structure of FIG. 22(b) or 23(b).

Incidentally, besides the electromechanical coupling coefficient $K^2$, the PFA and TCF are also cited as typical evaluation categories for surface acoustic wave substrates. Furthermore, with SAW devices having the respective laminated structures shown in FIGS. 22(a) through 23(b) and using a ZnO thin film as the piezoelectric thin film and a quartz substrate as the elastic substrate, spurious waves are generated which have approximately 110% of the acoustic velocity of the Rayleigh waves. Accordingly, the electromechanical coupling coefficient $K_{sp}^2$ of the spurious waves also becomes an important evaluation category.

Specifically, it is desirable that the PFA, TCF and $K_{sp}^2$ of a surface acoustic wave substrate be small.

Therefore, in a SAW device that has the structure of FIG. 22(b) using a quartz substrate as the elastic substrate and a ZnO thin film as the piezoelectric thin film, i.e., the same structure as that shown in FIG. 1(b), the relationships of the Euler angles (0°, θ, ψ) of the quartz substrate and the ZnO thin film thickness to the power flow angle (PFA) of the Rayleigh wave, temperature coefficient of frequency (TCF), electromechanical coupling coefficient $K^2$ of the Rayleigh wave, and electromechanical coupling coefficient $K_{sp}^2$ of the spurious wave, are calculated using the finite element method. The results are described with reference to FIGS. 6 through 9, 10 through 13, and 14 through 17.

Figure 6:
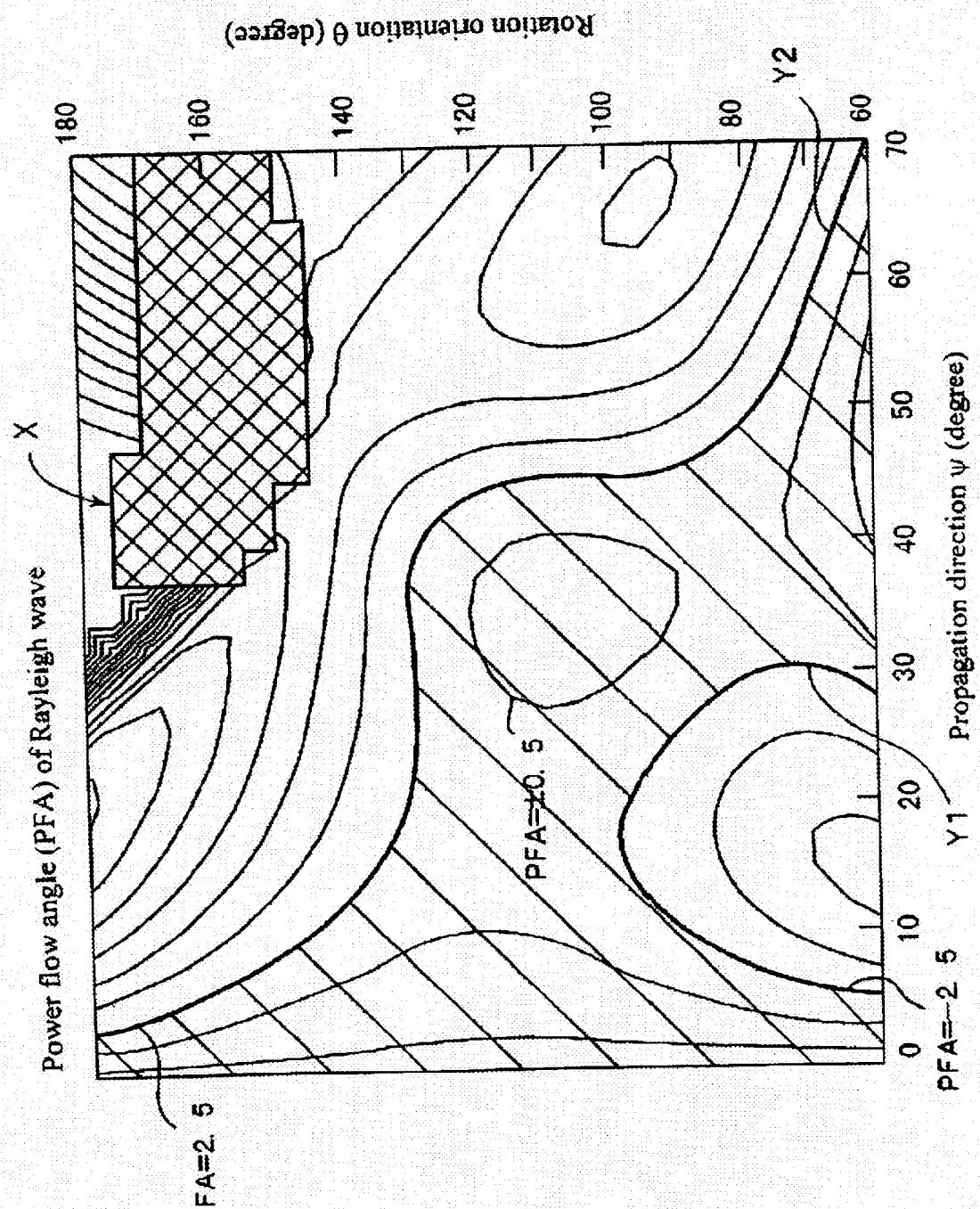
FIG. 6 is a graph showing the dependence of the power flow angle of Rayleigh waves on the substrate orientation when the normalized thickness of the ZnO film is about 0.20λ.
Figure 7:
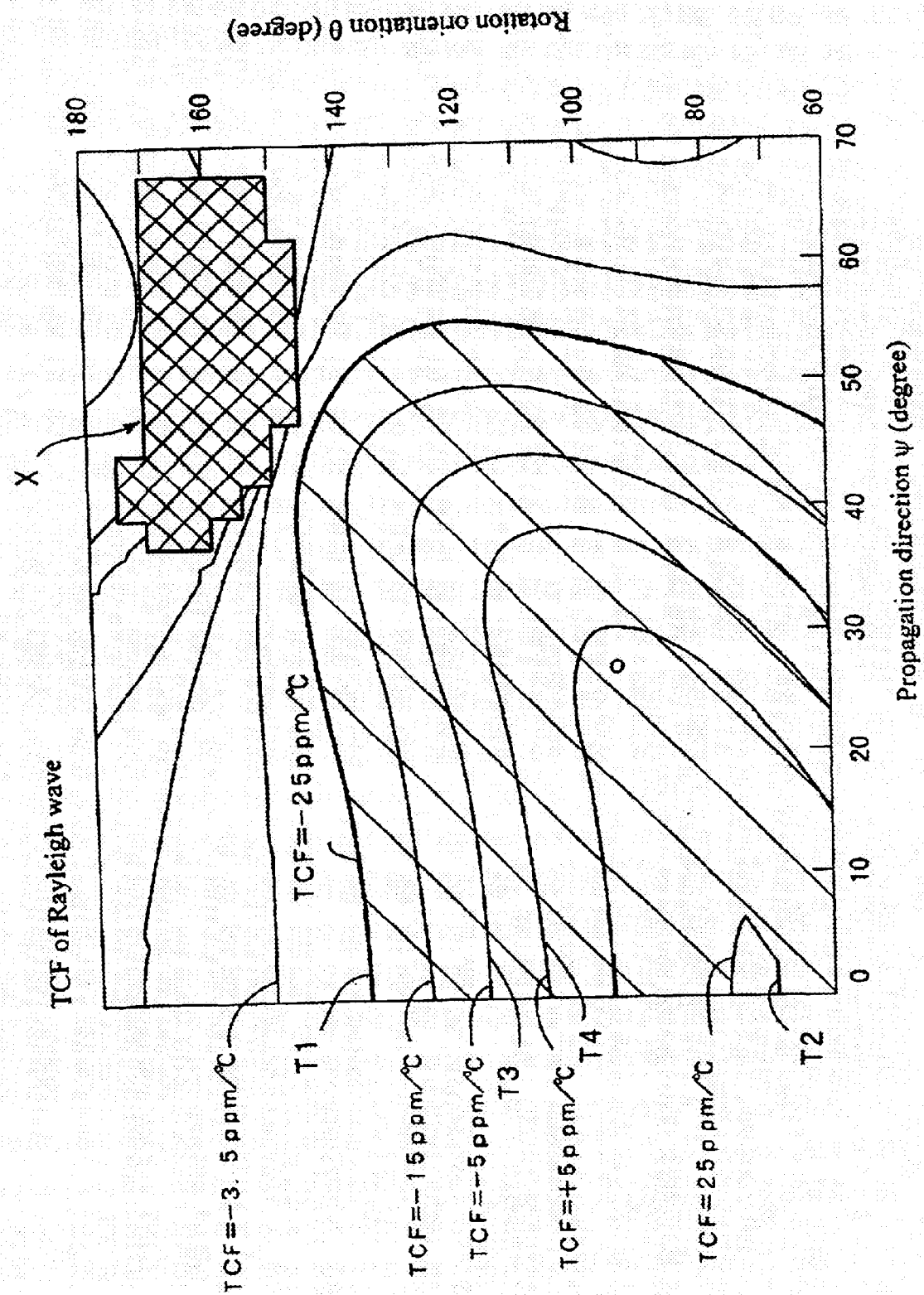
FIG. 7 is a graph showing the dependence of the temperature coefficient of frequency (TCF) of Rayleigh waves on the substrate orientation when the normalized thickness of the ZnO film is about 0.20λ.
Figure 8:
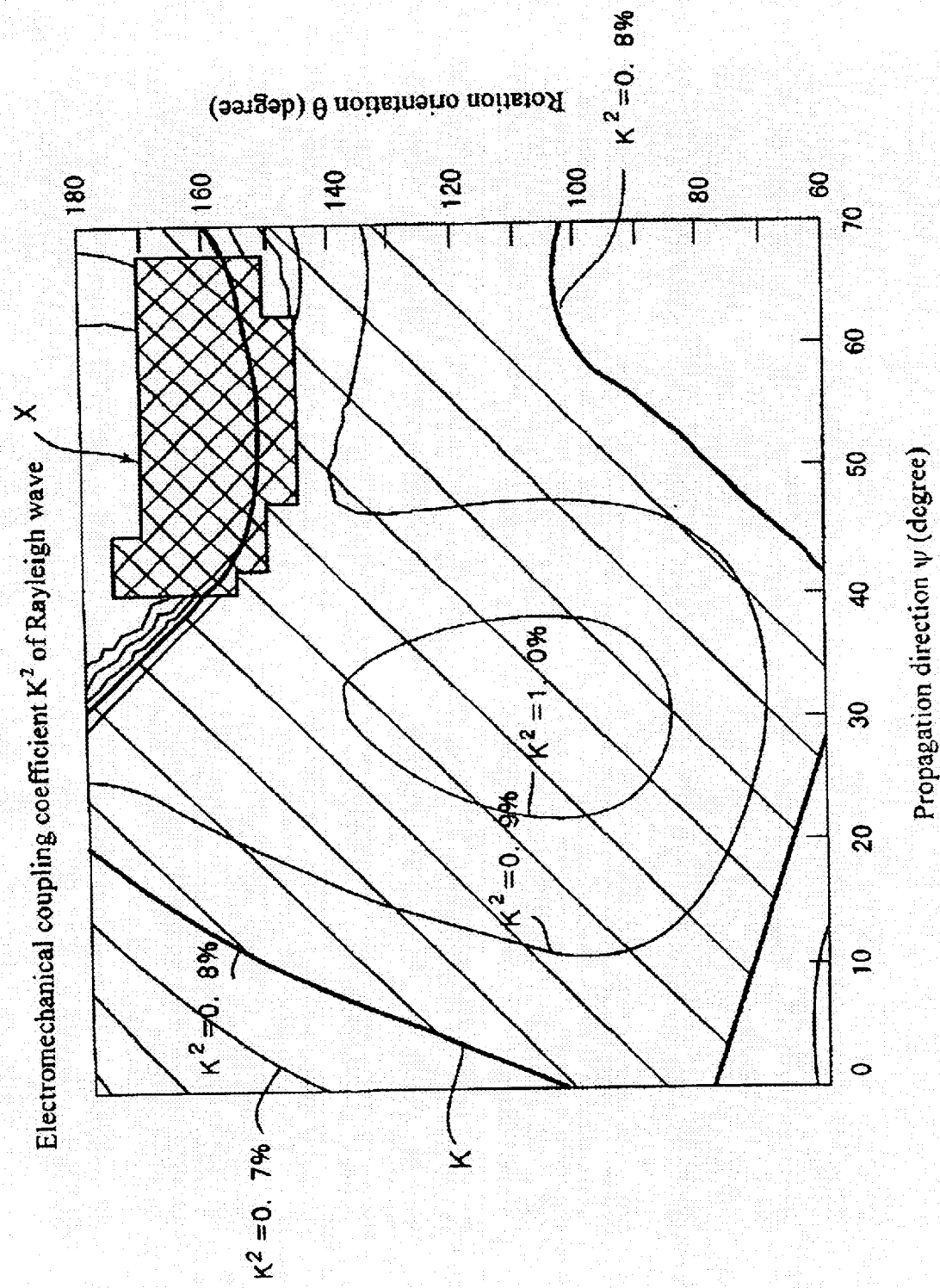
FIG. 8 is a graph showing the dependence of the electromechanical coupling coefficient $K^2$ of Rayleigh waves on the substrate orientation when the normalized thickness of the ZnO film is about 0.20λ.
Figure 9:
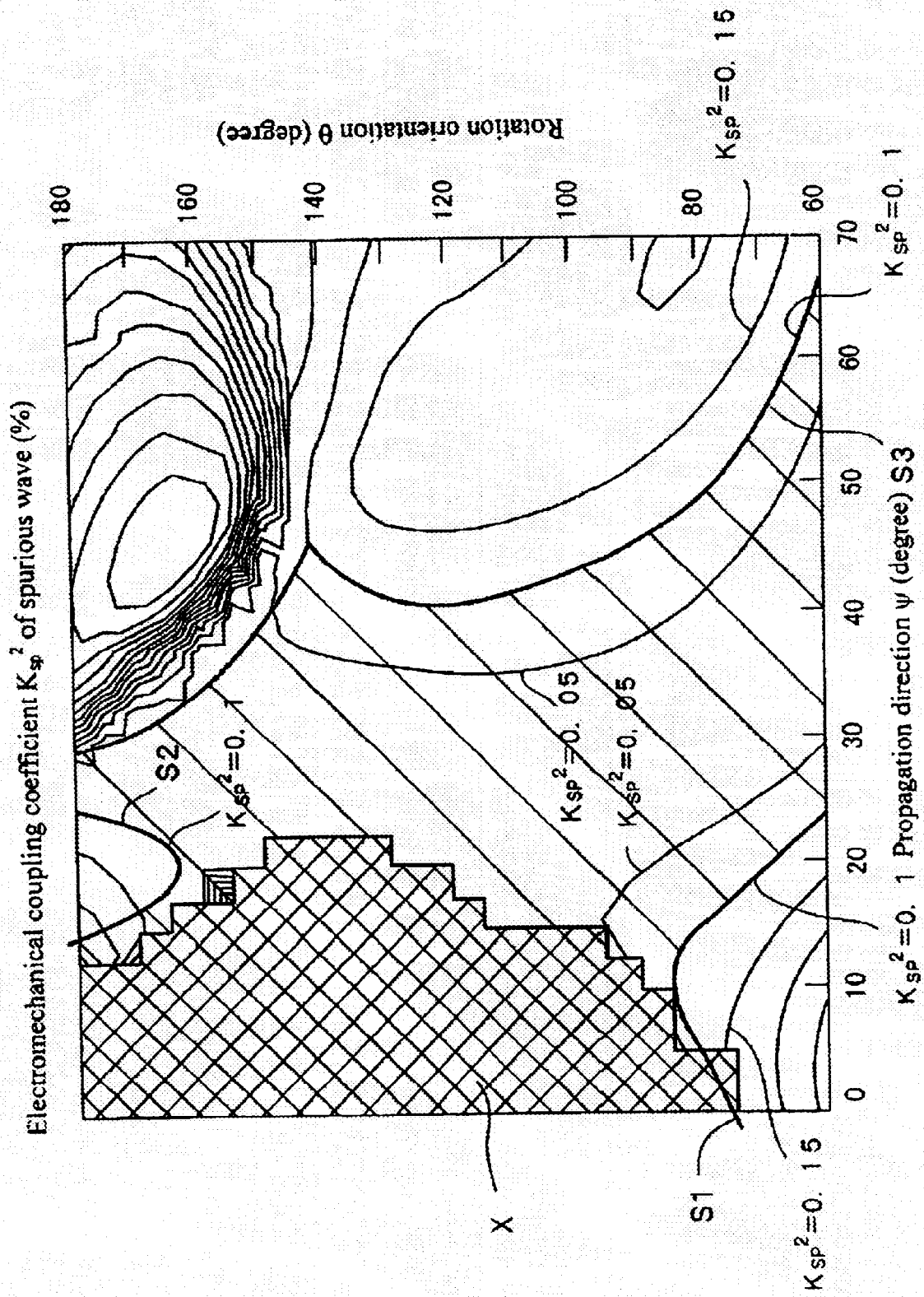
FIG. 9 is a graph showing the dependence of the electromechanical coupling coefficient $K_{sp}^2$ of spurious waves on the substrate orientation when the normalized thickness of the ZnO film is about 0.20λ.

FIGS. 6 through 9 are graphs illustrating the substrate orientation dependence of the surface acoustic wave propagating through the ZnO/Al/quartz substrate structure, and the normalized film thickness of the ZnO in this case is about 0.20λ. FIG. 6 shows the orientation dependence of the power flow angles of the Rayleigh wave, FIG. 7 shows the orientation dependence of the temperature coefficients of frequency (TCF) of the Rayleigh wave, FIG. 8 shows the orientation dependence of the electromechanical coupling coefficients $K^2$ of the Rayleigh wave, and FIG. 9 shows the orientation dependence of the electromechanical coupling coefficients $K_{sp}^2$ of the spurious wave.

The respective contour lines in FIGS. 6 through 9 indicate that the above-mentioned power flow angles (PFA), temperature coefficients of frequency (TCF), and electromechanical coupling coefficients $K^2$ and $K_{sp}^2$ are the same in these portions. FIGS. 10 through 13 and 14 through 17 are also graphs showing similar results, but the normalized thickness of the ZnO film is about 0.25λ in FIGS. 10 through 13, and the normalized thickness of the ZnO film is about 0.30λ in FIGS. 14 through 17.

Figure 10:
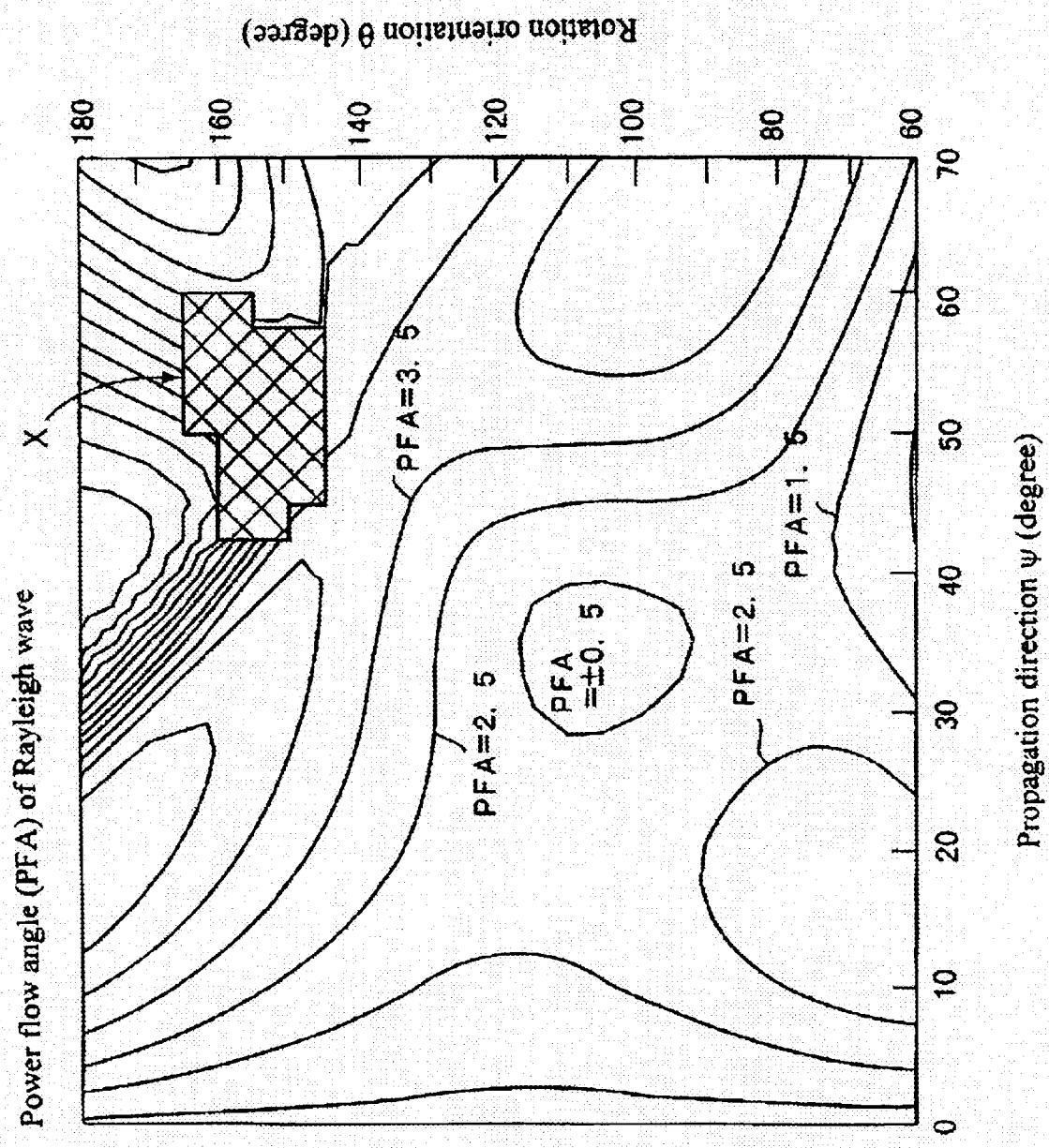
FIG. 10 is a graph showing the dependence of the power flow angle of Rayleigh waves on the substrate orientation when the normalized thickness of the ZnO film is about 0.25λ.
Figure 11:
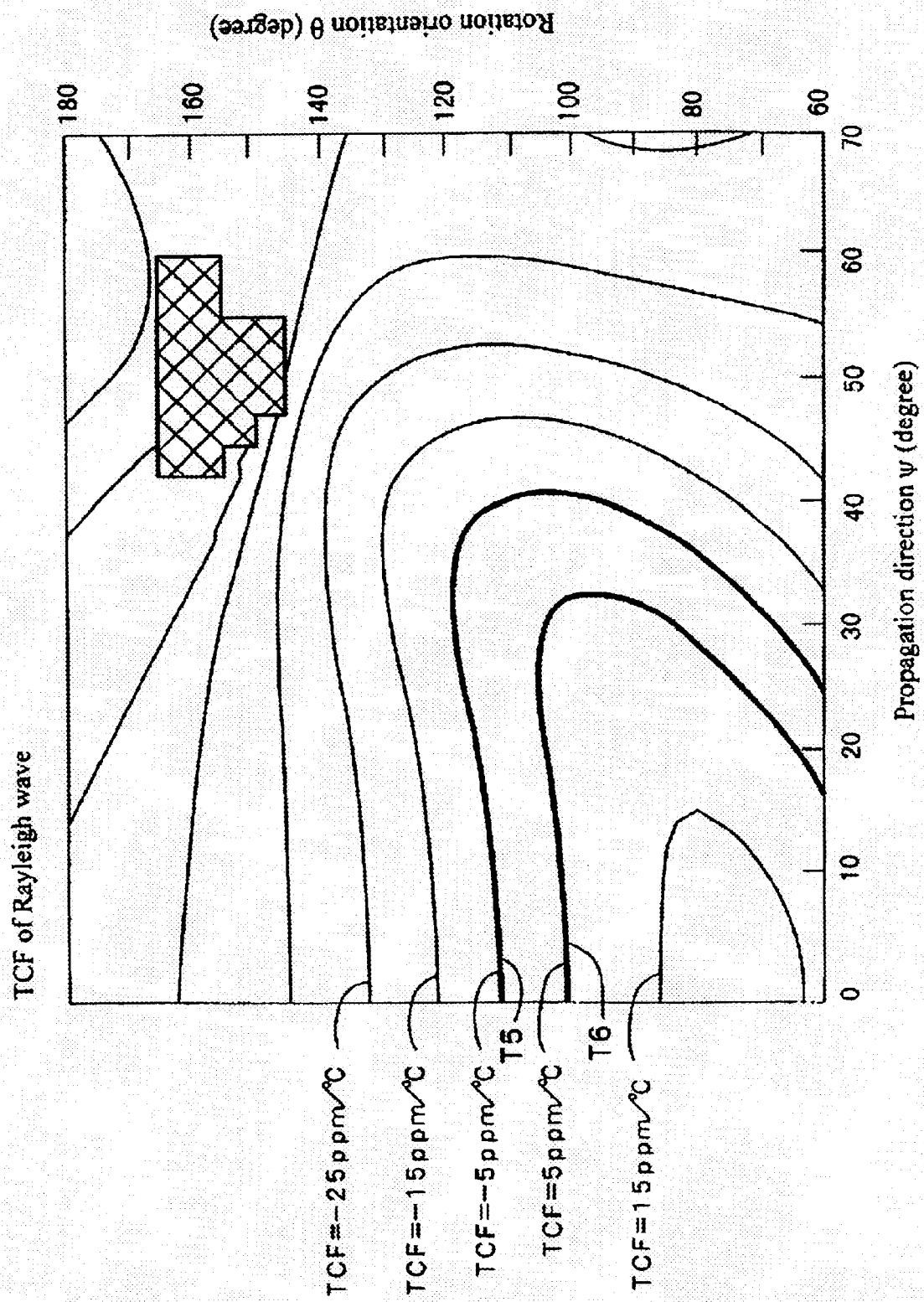
FIG. 11 is a graph showing the dependence of the temperature coefficient of frequency (TCF) of Rayleigh waves on the substrate orientation when the normalized thickness of the ZnO film is about 0.25λ.
Figure 12:
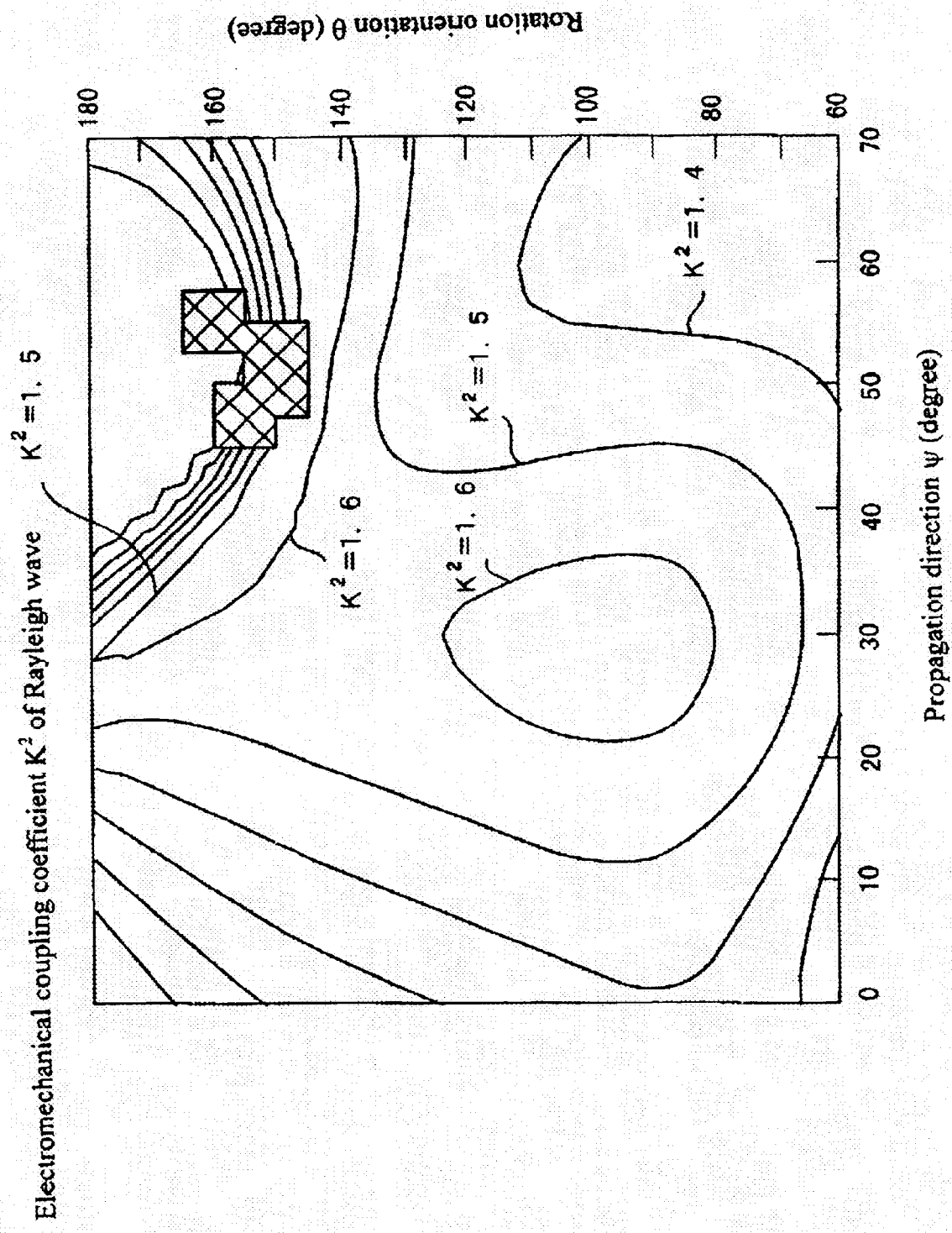
FIG. 12 is a graph showing the dependence of the electromechanical coupling coefficient $K^2$ of Rayleigh waves on the substrate orientation when the normalized thickness of the ZnO film is about 0.25λ.
Figure 13:
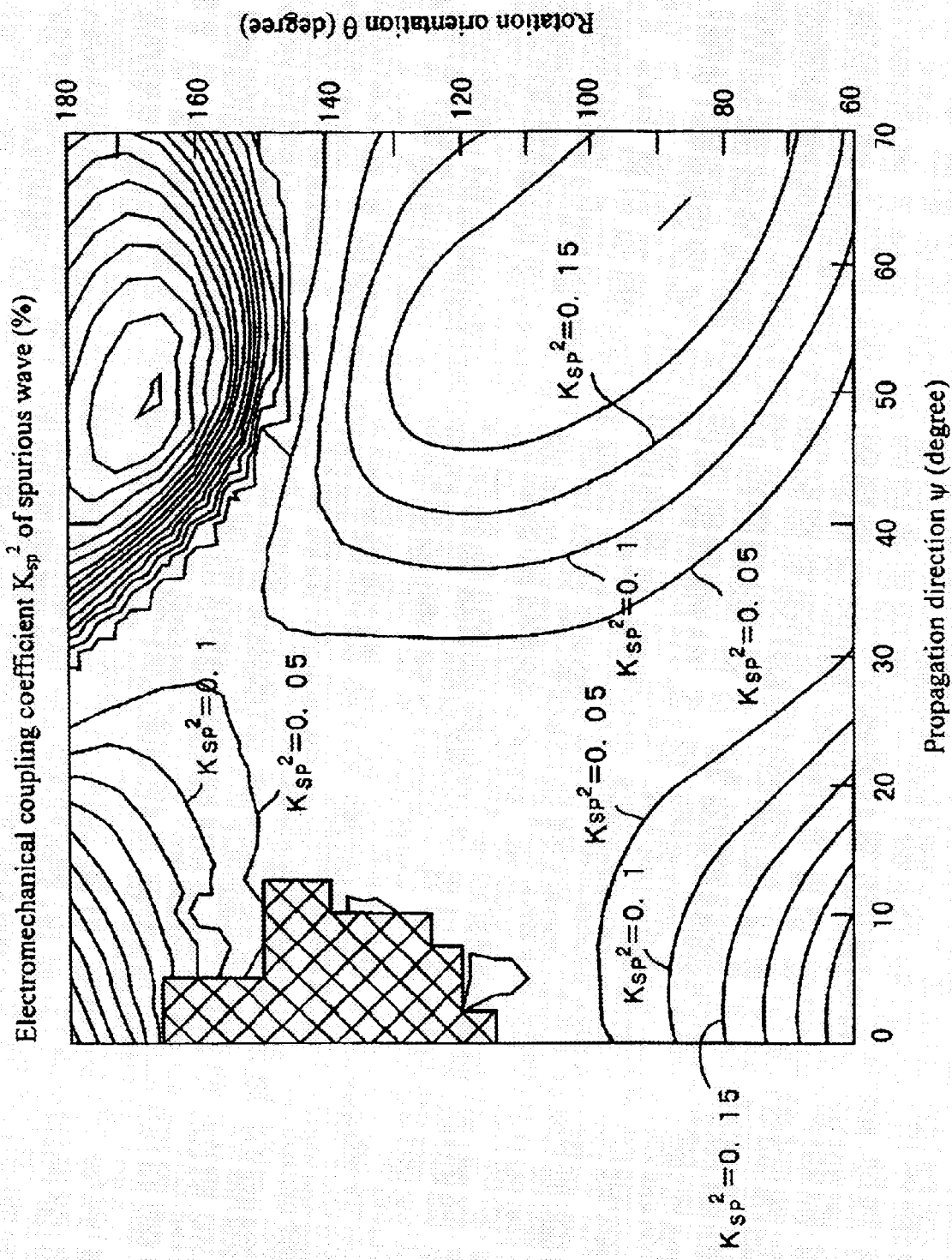
FIG. 13 is a graph showing the dependence of the electromechanical coupling coefficient $K_{sp}^2$ of spurious waves on the substrate orientation when the normalized thickness of the ZnO film is about 0.25λ.
Figure 14:
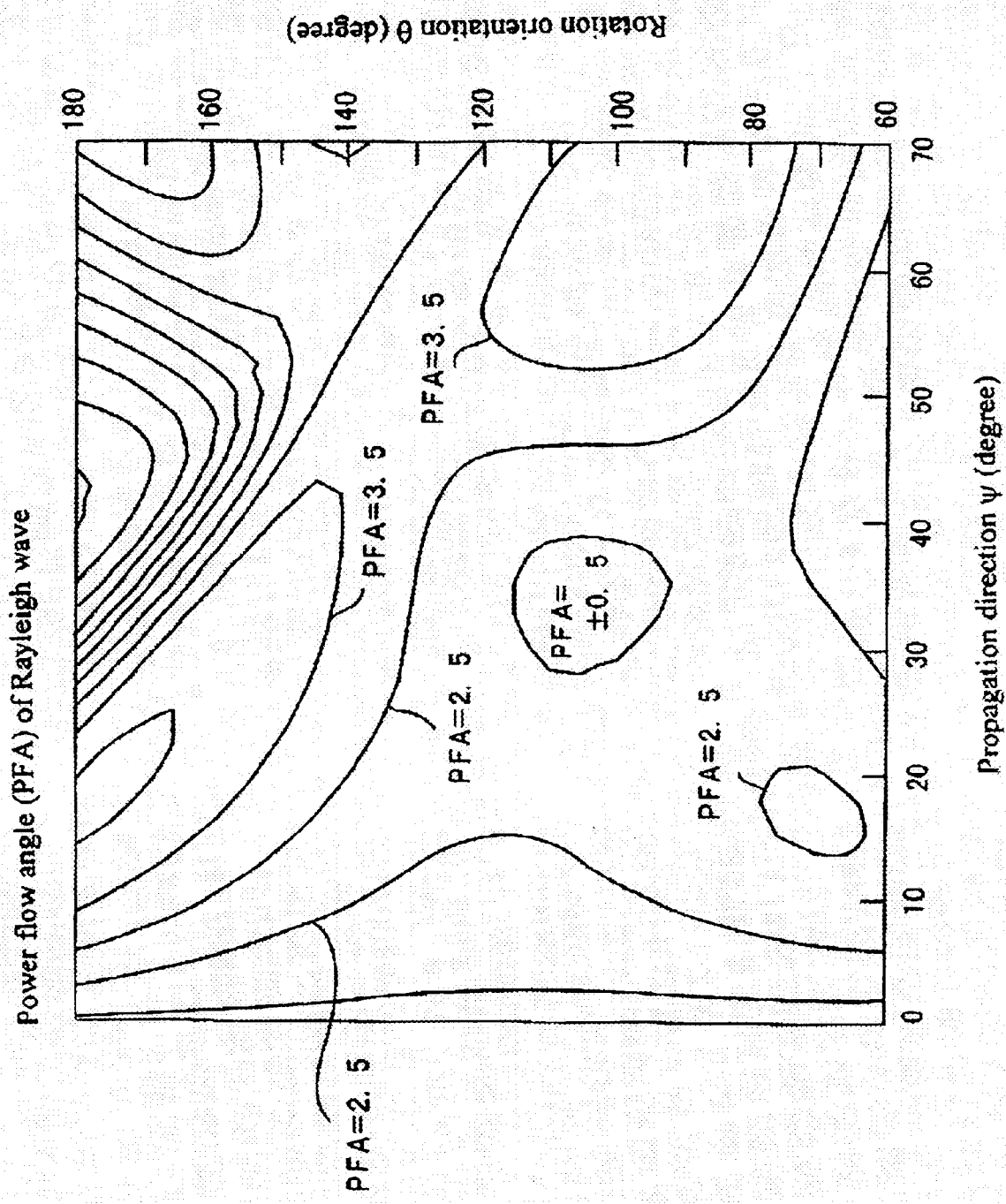
FIG. 14 is a graph showing the dependence of the power flow angle of Rayleigh waves on the substrate orientation when the normalized thickness of the ZnO film is about 0.30λ.
Figure 15:
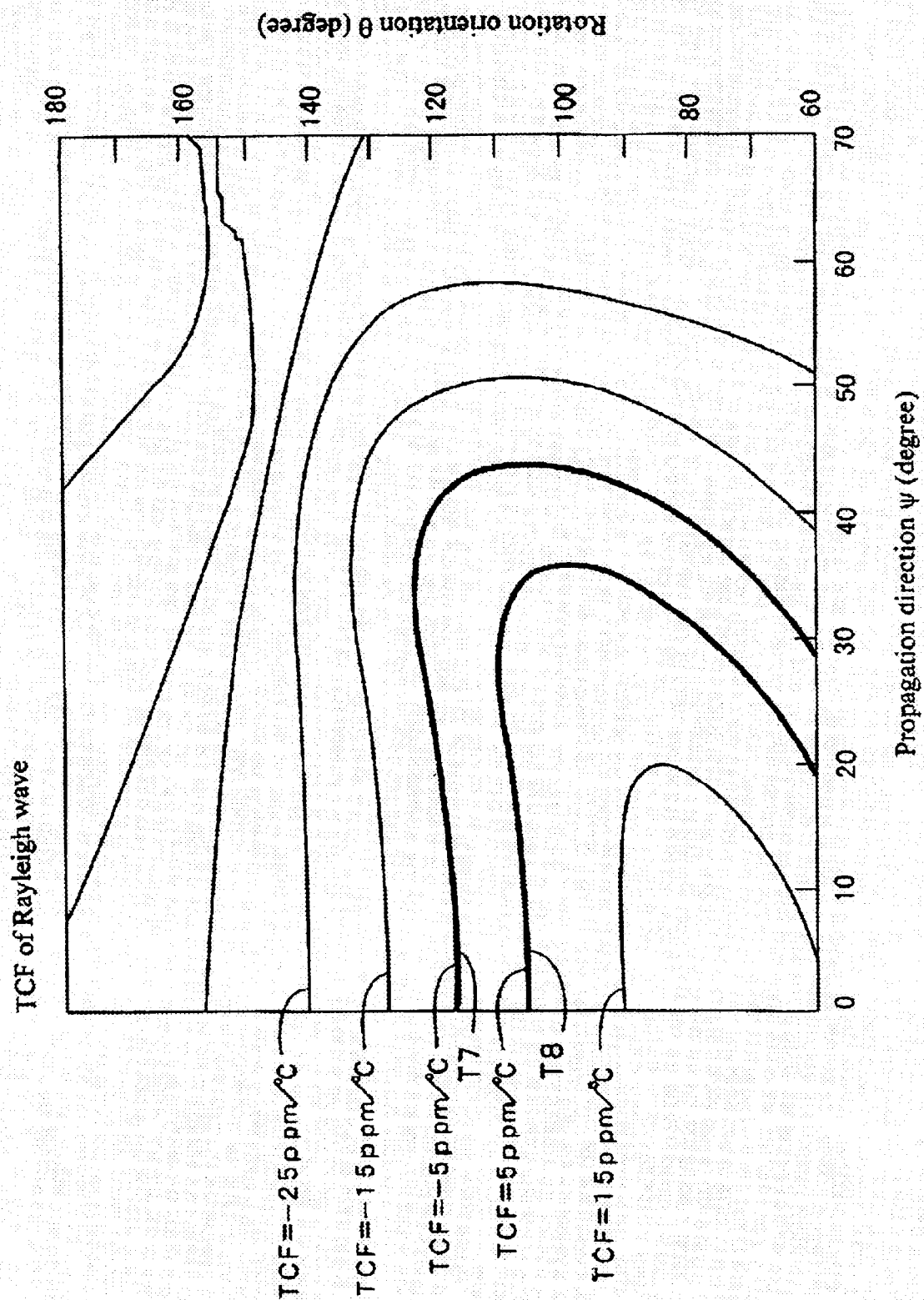
FIG. 15 is a graph showing the dependence of the temperature coefficient of frequency (TCF) of Rayleigh waves on the substrate orientation when the normalized thickness of the ZnO film is about 0.30λ.
Figure 16:
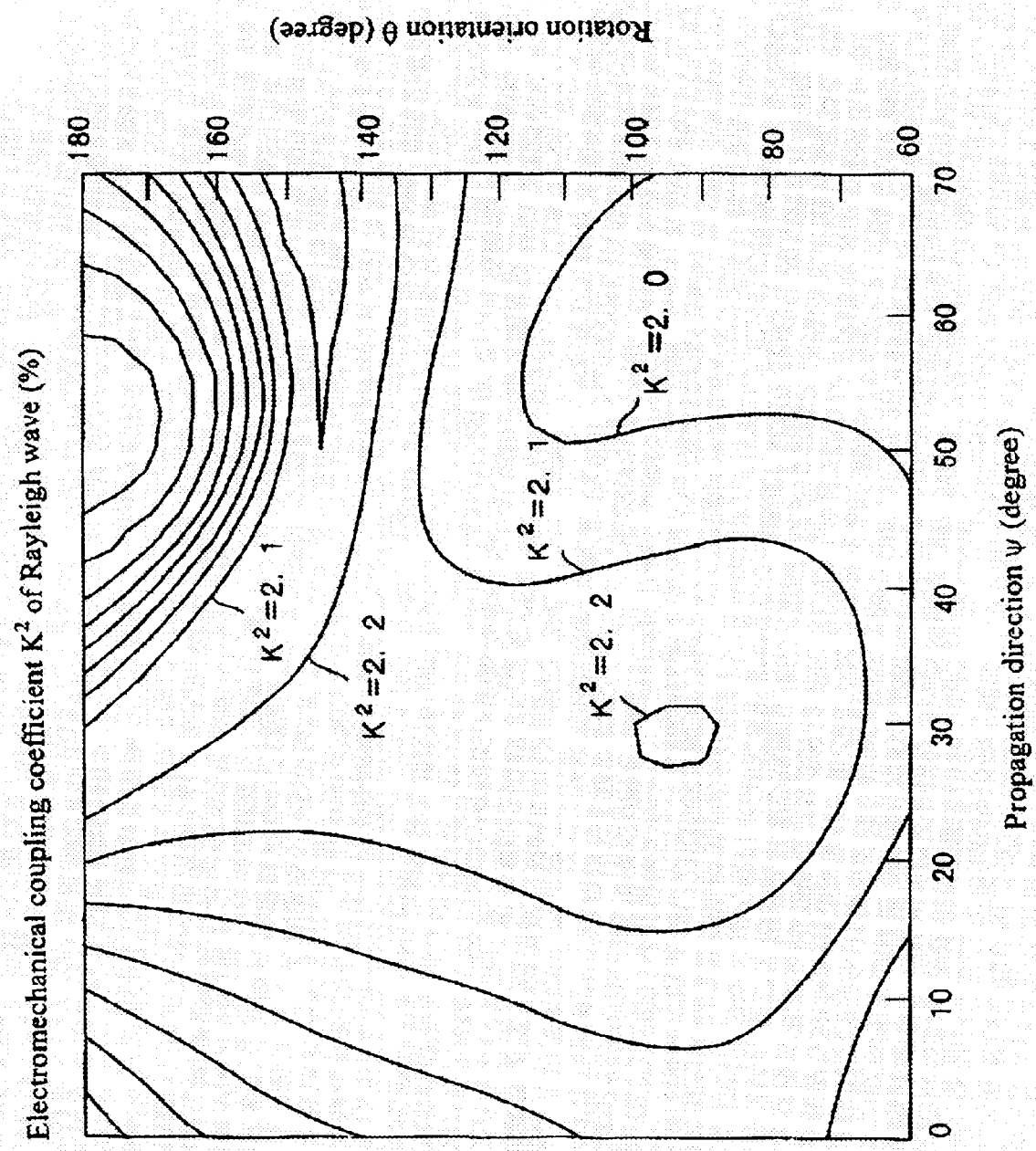
FIG. 16 is a graph showing the dependence of the electromechanical coupling coefficient $K^2$ of Rayleigh waves on the substrate orientation when the normalized thickness of the ZnO film is about 0.30λ.

The hatched areas with diagonally crossing lines indicated by X in FIGS. 6 through 17 are the conditions in which no calculated values were initially obtained for reasons such as small electromechanical coupling coefficients $K^2$. The respective PFAs and TCFs in FIGS. 6, 10, and 14 and in FIGS. 7, 11, and 15 are values obtained by Equations (2) and (3) below.

$$PFA = \tan^{-1}(Vf^{-1} \times \partial Vf/\partial \psi) \quad \text{Equation (2)}$$

$$TCF = Vf^{-1} \times \partial Vf/\partial T - \alpha \quad \text{Equation (3)}$$

In Equation (2), ψ indicates the surface acoustic wave propagation direction (degree), T indicates the temperature (° C.), and α indicates the thermal expansion coefficient in the surface acoustic wave propagation direction.

It is seen from FIGS. 6, 10, and 14 that the condition in which the power flow angles (PFA) are small (−2.5 to +2.5°) is the hatched area with diagonal lines surrounded by the thick lines Y1 and Y2 in FIG. 6.

Furthermore, it is understood from FIGS. 7, 11, and 15 that the condition in which the temperature coefficients of frequency (TCF) are small (−25 to +25 ppm/° C.) is the hatched area with diagonal lines surrounded by the lines T1 and T2 in FIG. 7, and that the condition of the TCFs of −5 to +5 ppm/° C., in particular, which is smaller than in the case of the $Li_2B_4O_7$ substrate, is the areas surrounded by the lines T3 and T4 in FIG. 7, the lines T5 and T6 in FIG. 11, and the lines T7 and T8 in FIG. 15.

Moreover, if the ZnO film thickness is increased to at least about 0.05λ as described above, the electromechanical coupling coefficient $K^2$ can be larger than when the ZnO thin film is not formed, and this coefficient can be further improved by adjusting the Euler angles. For example, the electromechanical coupling coefficients are at least about 0.8% in the area surrounded by the thick lines K in FIG. 8, indicating values that are equal to or larger than the coupling coefficient of the conventional SAW device of FIG. 22(a). If the ZnO film thickness is increased, the coupling coefficient is increased at all Euler angles, but the area surrounded by the thick lines K in FIG. 8 is the area in which the coupling coefficient is large at a specific film thickness.

Figure 17:
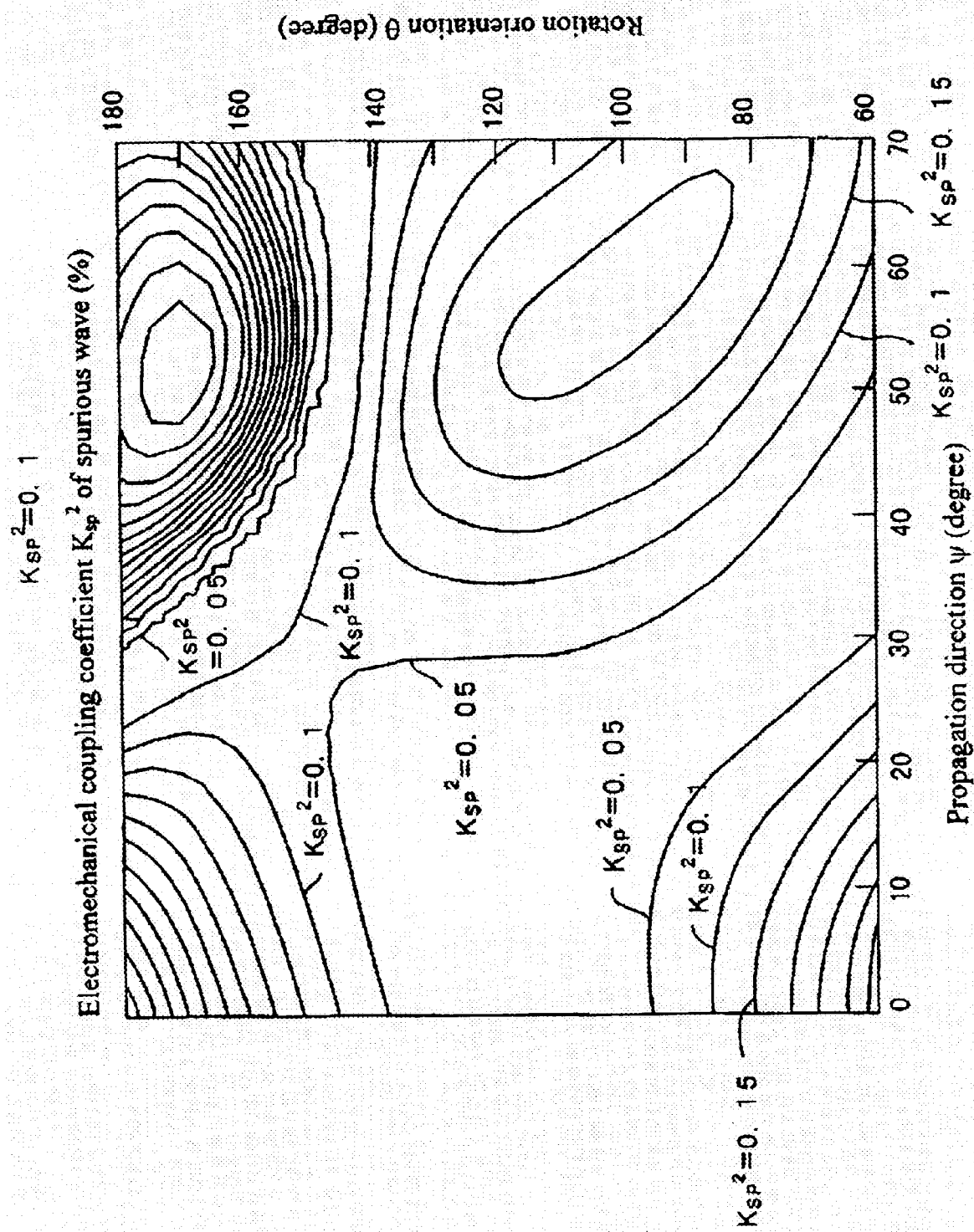
FIG. 17 is a graph showing the dependence of the electromechanical coupling coefficient $K_{sp}^2$ of spurious waves on the substrate orientation when the normalized thickness of the ZnO film is about 0.30λ.

It is also apparent from FIGS. 9, 13, and 17 that the condition in which the electromechanical coupling coefficient $K_{sp}^2$ of the spurious waves is small (0 to 0.1) is the area surrounded by the thick lines S1, S2, and S3 in FIG. 9.

When IDTs are constructed solely from double-electrodes, which do not produce the reflection of surface acoustic waves, it is necessary to keep the electromechanical coupling coefficient $K_{sp}^2$ to about 0.1% or less as described above in order to suppress the spurious response to a relative insertion loss of about 30 dB or less, which is required for CDMA-IF filters, and the like. Here, the relative insertion loss refers to the difference between the insertion loss of the Rayleigh wave response and the insertion loss of the spurious wave response.

Furthermore, the inventors of the present application have confirmed through experiments that the reflection coefficient of the spurious wave is at least 10 times of the reflection coefficient of the Rayleigh wave. Therefore, when IDTs are constructed from single-electrodes or unidirectional electrodes, which produce surface acoustic wave reflections, because the spurious wave shows a large surface acoustic wave reflection coefficient, a resonance action occurs in the IDTs as a single unit, generating large spurious radiation outside the frequency band even with a very small electromechanical coupling coefficient $K_{sp}^2$.

Figure 28:
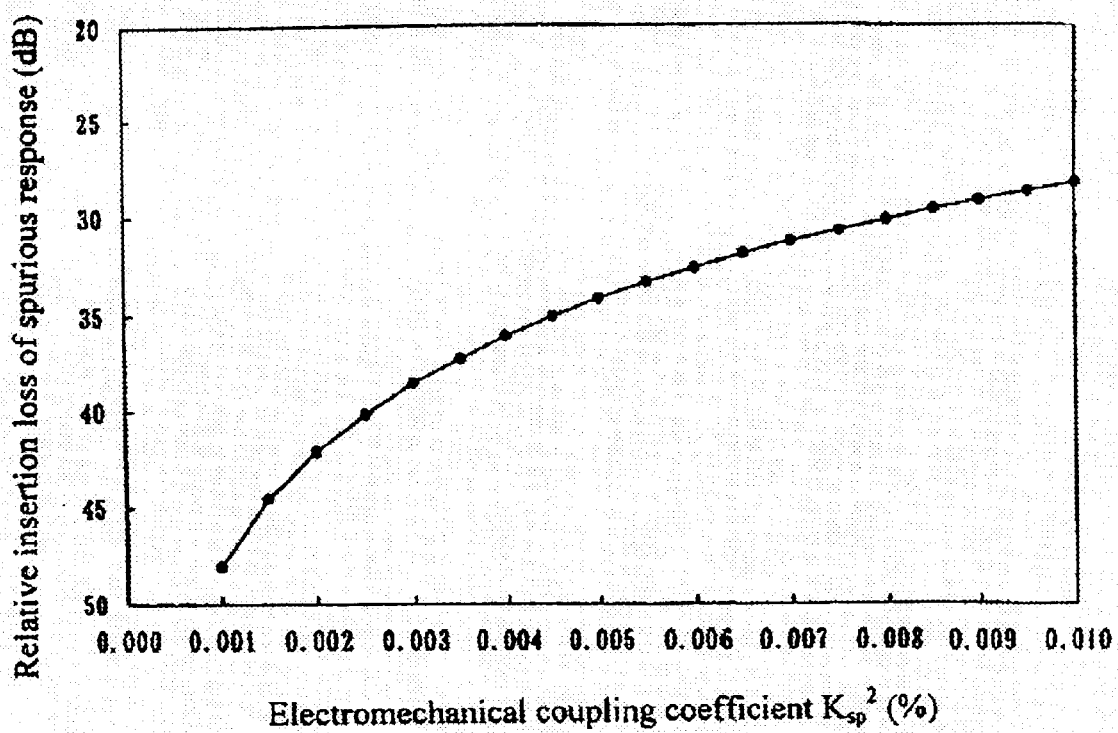
FIG. 28 shows the relationship between the electromechanical coupling coefficient $K_{sp}^2$ of the spurious wave and the insertion loss of the spurious wave.

FIG. 28 shows the relationship between the electromechanical coupling coefficient $K_{sp}^2$ of the spurious wave and the relative insertion loss of the spurious wave in the case of disposing, both in the input side and output side, 100 pairs of the unidirectional electrodes disclosed in U.S. Pat. No. 4,162,465, in which two strips having the respective widths of λ/16 and 3λ/16λ are disposed in the half-wavelength region. In this case, the thickness of the ZnO thin film is preferably about 0.3λ, the thickness of the electrodes composed of Al is preferably about 0.02λ, and the Euler angles of the quartz substrate are (0°, 116°, 0°).

It is seen from FIG. 28 that the electromechanical coupling coefficient $K_{sp}^2$ must be reduced to about 0.008% or less in order to suppress the spurious response to a relative insertion loss of about 30 dB or lower.

Therefore, the inventors of the present application experimentally confirmed the ranges of the Euler angles (φ, θ, ψ) of a quartz substrate in which the spurious wave can be suppressed. The results are described through reference to FIGS. 29 through 31. Here, the thickness of the ZnO thin film is preferably about 0.3λ, and the thickness of the electrodes composed of Al is preferably about 0.02λ.

Figure 29:
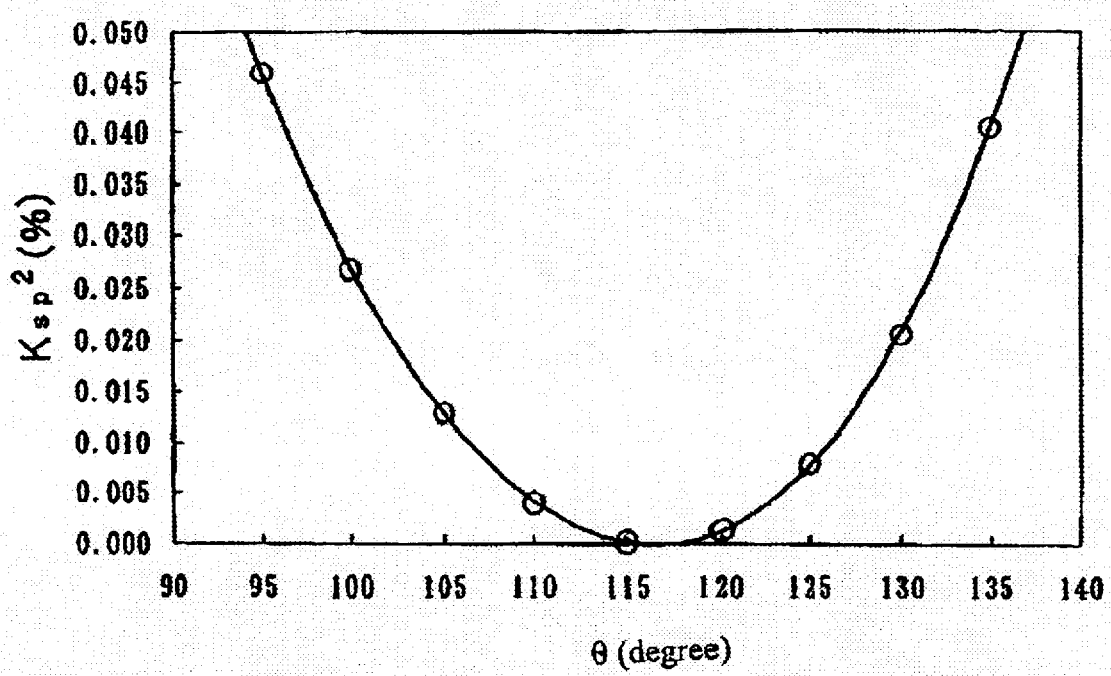
FIG. 29 shows the relationship between the electromechanical coupling coefficient $K_{sp}^2$ of the spurious wave and the substrate orientation θ with respect to the aluminum film thickness.

FIG. 29 shows the relationship between the electromechanical coupling coefficient $K_{sp}^2$ of the spurious wave and the substrate orientation θ with respect to the aluminum film thickness. It is apparent from FIG. 29 that the substrate orientation θ may be set such that 107°<θ<125° in order to reduce the electromechanical coupling coefficient $K_{sp}^2$ of the spurious wave to about 0.008% or less. Furthermore, θ of about 116°±5° is preferable, and the electromechanical coupling coefficient $K_{sp}^2$ of the spurious wave in this case is about 0.005% or less.

Figure 30:
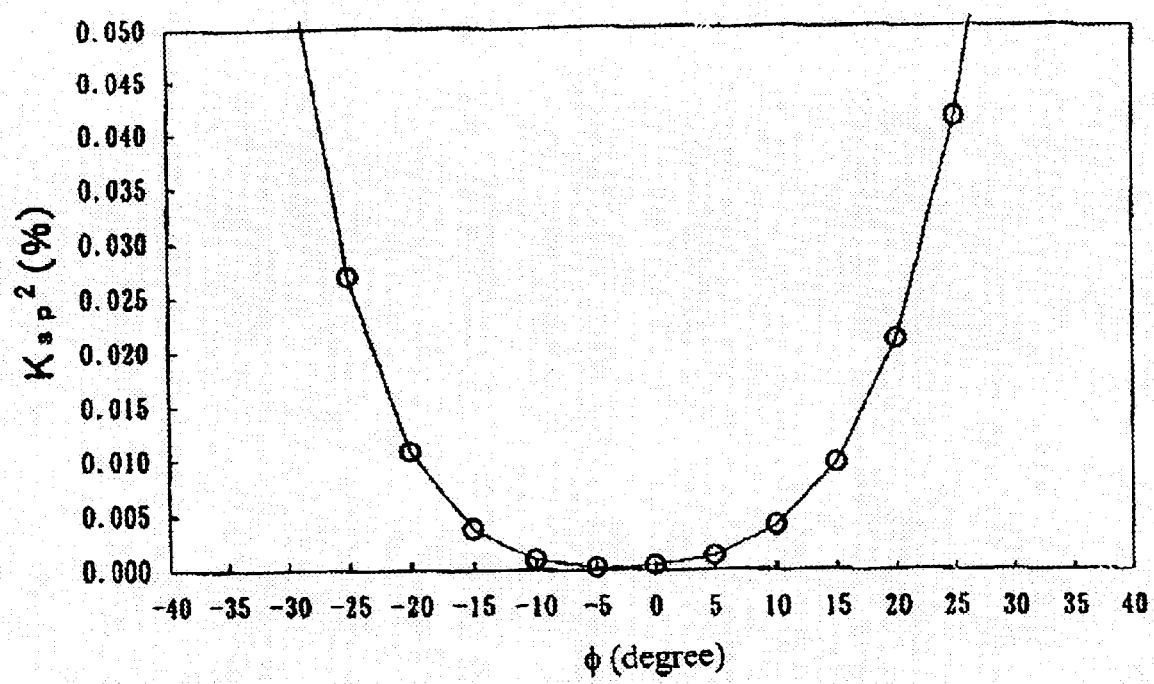
FIG. 30 shows the relationship between the electromechanical coupling coefficient $K_{sp}^2$ of the spurious wave and the substrate orientation φ.

Moreover, FIG. 30 shows the relationship between the electromechanical coupling coefficient $K_{sp}^2$ of the spurious wave and the substrate orientation φ. It is apparent from FIG. 30 that the substrate orientation φ may be set in the range of approximately −19° to +15° in order to reduce the electromechanical coupling coefficient $K_{sp}^2$ of the spurious wave to about 0.008% or less. It is also seen that setting φ in the range of about −2.5°±5° makes it possible to keep the electromechanical coupling coefficient $K_{sp}^2$ of the spurious wave down to about 0.005% or less.

Figure 31:
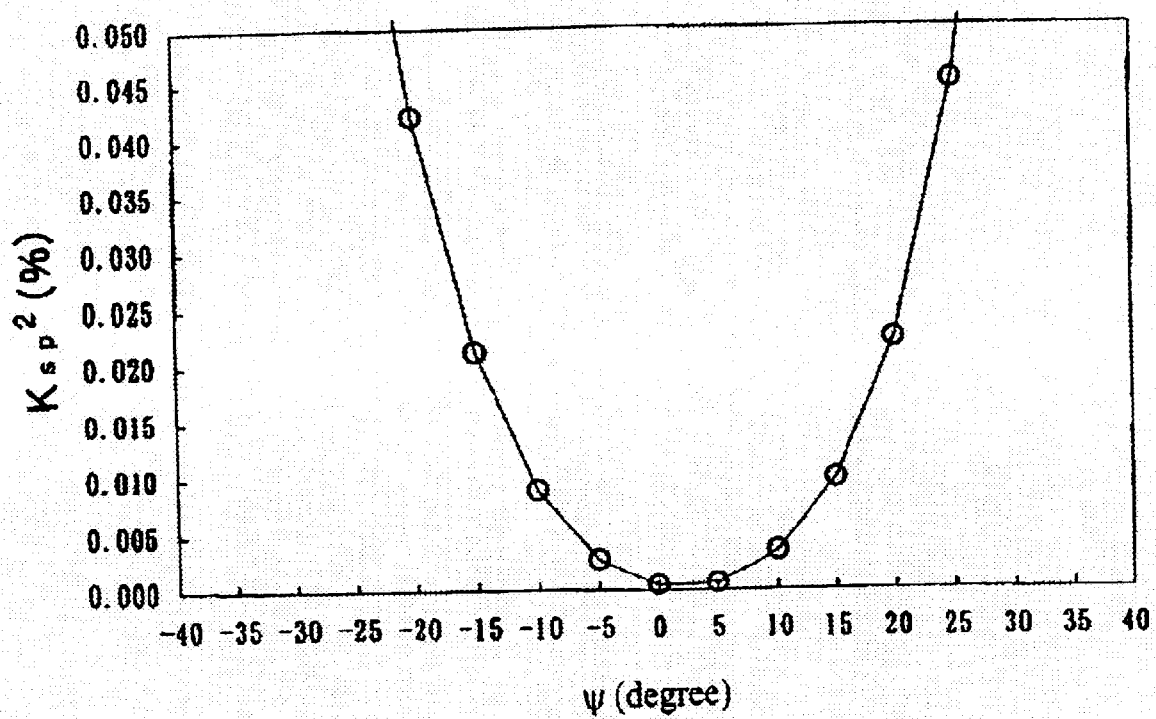
FIG. 31 shows the relationship between the electromechanical coupling coefficient $K_{sp}^2$ of the spurious wave and the propagation orientation ψ.

FIG. 31 shows the relationship between the electromechanical coupling coefficient $K_{sp}^2$ of the spurious wave and the propagation orientation ψ. It is understood from FIG. 31 that the propagation orientation ψ may be set in the range of about −100 to about +15° in order to reduce the electromechanical coupling coefficient $K_{sp}^2$ of the spurious wave to about 0.008% or less. It is also seen that setting ψ in the range of about +2.5°±5° makes it possible to keep the electromechanical coupling coefficient $K_{sp}^2$ of the spurious wave down to about 0.005% or less.

Table 2 shows the experimental values obtained when disposing, both in the input side and output side, 40 pairs of unidirectional electrodes in which two strips having the respective widths of λ/16 and 3λ/16λ are disposed in the half-wavelength region.

TABLE 2

| Euler Angles of Quartz Substrate | Insertion Loss of Rayleigh Wave | Insertion Loss of Spurious Wave |
| --- | --- | --- |
| (0°, 116.00°, 0°) | 15.2 dB | Not confirmed |
| (0°, 117.00°, 0°) | 15.4 dB | 55.0 dB |
| (0°, 122.00°, 0°) | 15.0 dB | 47.2 dB |
| (0°, 132.75°, 0°) | 15.1 dB | 14.5 dB |

As is indicated in FIGS. 28 through 31, furthermore, it is confirmed that the effect of reducing the electromechanical coupling coefficient $K_{sp}^2$ of the spurious wave can be exhibited not only with the structure of FIG. 1(b) but also with the structure shown in FIG. 22(a), in which comb electrodes are formed on a piezoelectric thin film. Accordingly, in various preferred embodiments of the present invention, it is sufficient if comb electrodes are arranged so as to contact the piezoelectric thin film.

Thus, it is understood that in a surface acoustic wave device in which a piezoelectric thin film is disposed on a quartz substrate, and comb electrodes are arranged so as to contact the piezoelectric thin film, setting the Euler angles of the quartz substrate within the above-mentioned ranges makes it possible to obtain a surface acoustic wave device showing a small PFA, TCF, and $K_{sp}^2$ and a large electromechanical coupling coefficient $K^2$ of a Rayleigh wave.

Next, a specific experimental example is described.

Incidentally, the power flow angle refers to the angle indicating the difference between the phase-velocity direction and group-velocity direction of the surface acoustic wave, and when the power flow angle is present, the surface acoustic wave energy propagates with a deviation of the power flow angle with respect to the direction perpendicular to the electrode fingers of the comb electrodes. The surface acoustic wave energy loss $L_{PFA}$ in this case is expressed by Equation (4) below.

$$L_{PFA}=10\times\log_{10}[\{W-\tan(PFA)\}/W](dB/\lambda) \qquad \text{Equation (4)}$$

In Equation (4), W indicates the crossing width of the comb electrodes that is normalized by the wavelength λ of the surface acoustic wave.

Figure 21:
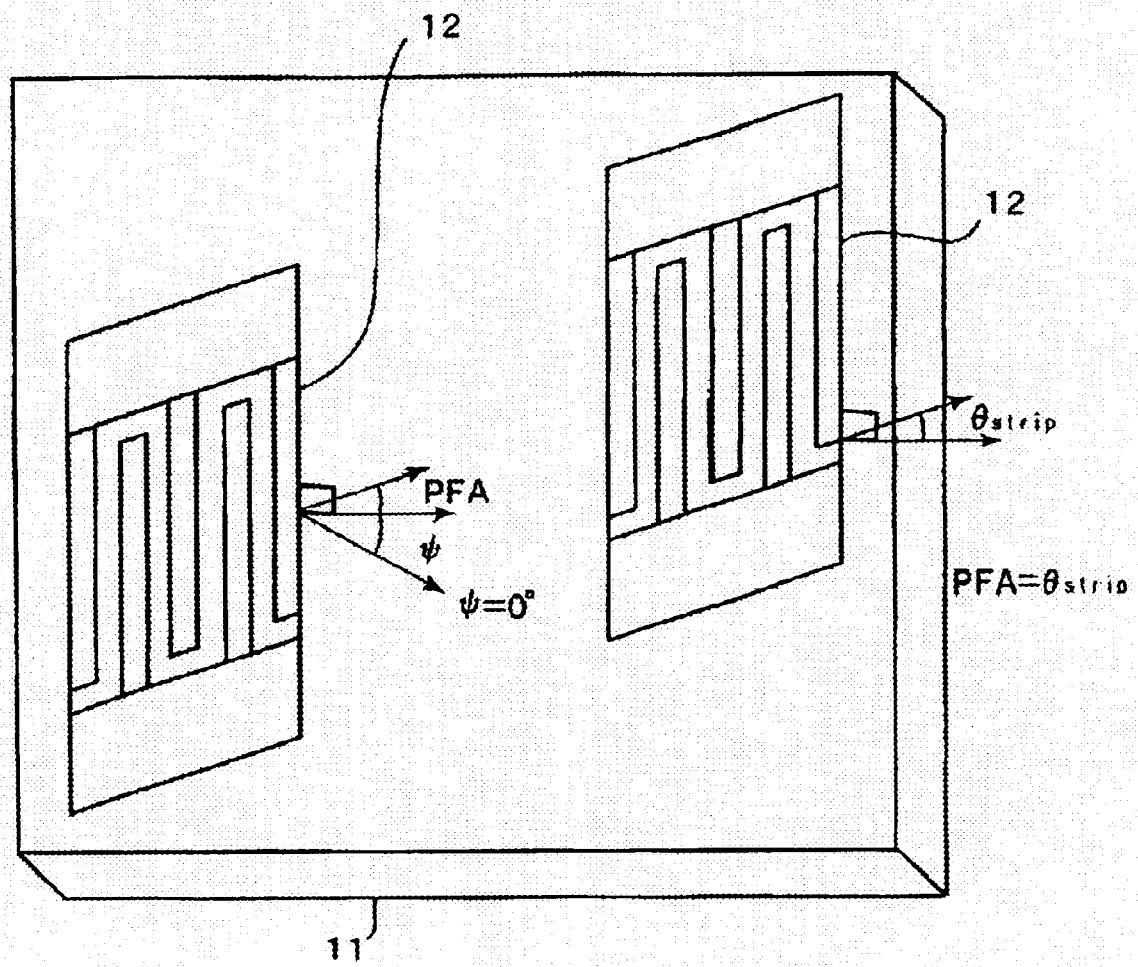
FIG. 21 is a model diagram used to illustrate the relationship between the power flow angle (PFA) and the electrode finger disposition angle $\theta_{strip}$ of comb electrodes in a surface acoustic wave device.

Therefore, it is desirable that the power flow angle (PFA) be 0° in the surface acoustic wave substrate as described above. However, in cases where the PFA is present, by matching the PFA and the electrode finger disposition angle $\theta_{strip}$ of comb electrodes 12 on the surface acoustic wave substrate 11 as shown in FIG. 21, it is possible to suppress the deterioration of an insertion loss caused by the difference between the PFA and $\theta_{strip}$, though the degree of the difficulty of the comb electrode design is increased.

Conversely, if the electrode finger disposition angle and PFA are different, the insertion loss deteriorates.

With the surface acoustic wave substrate according to various preferred embodiments of the present invention, a spurious wave having the acoustic velocity that is approximately 110% of that of the Rayleigh wave is present. In the case of the above-mentioned comb electrodes in which the electrode finger disposition angle $\theta_{strip}$ is matched with the power flow angle (PFA) of the Rayleigh wave, when the difference of the power flow angles between the Rayleigh wave and spurious wave is designated by ΔPFA, the spurious wave loss $L_{PFASP}$ caused by ΔPFA is expressed by Equation (5) below, as with Equation (4).

$$L_{PFASP}=10\times\log_{10}[\{W-\tan(\Delta PFA)\}/W](dB/\lambda) \qquad \text{Equation (5)}$$

It is apparent from Equation (5) that the spurious wave response can be suppressed by increasing ΔPFA. For example, in cases where 20λ of the surface acoustic wave propagates in the comb electrodes having W of 10λ, if ΔPFA is about 1°, the spurious wave can be suppressed by about 1.5 dB.

Figure 18:
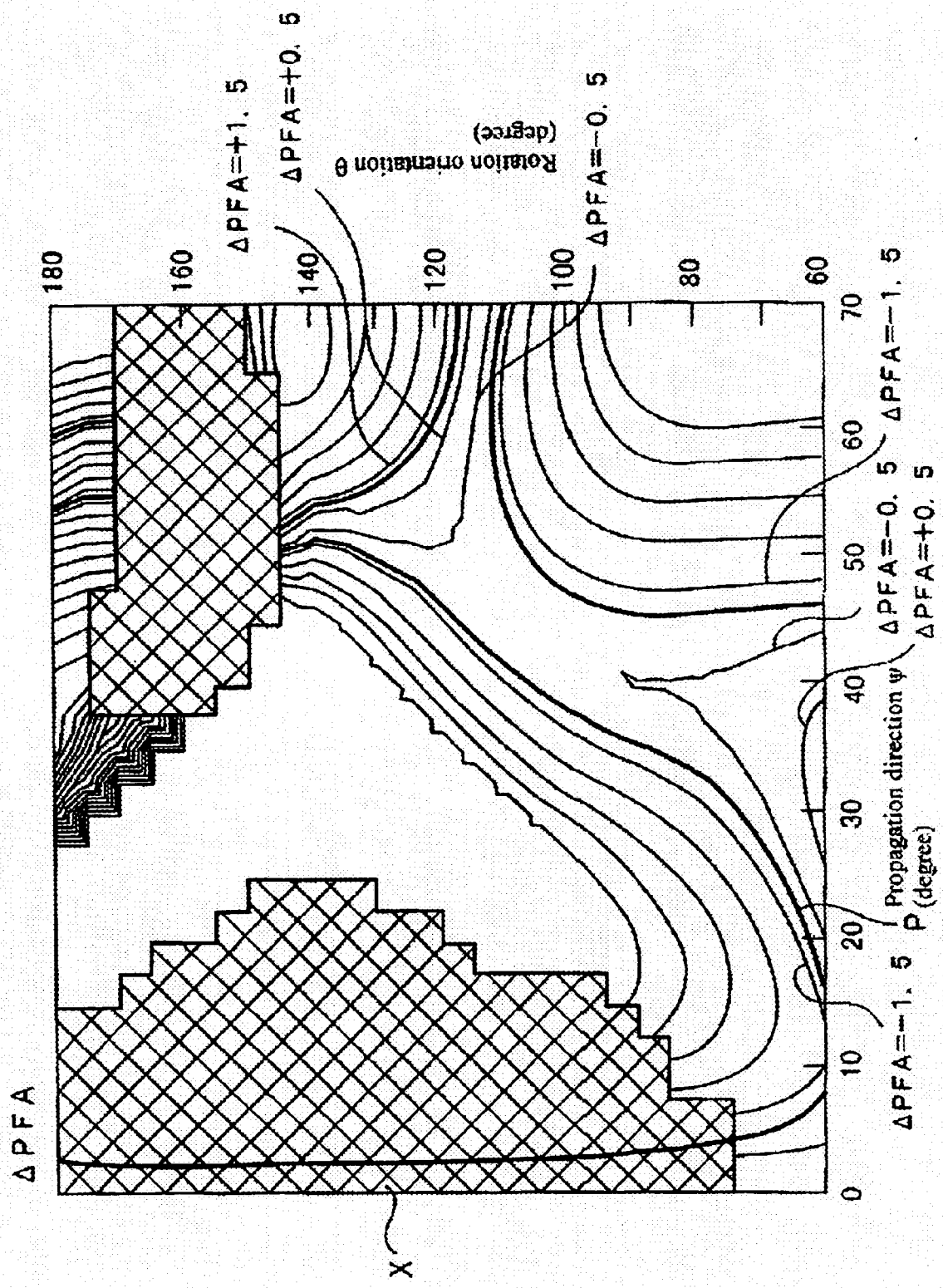
FIG. 18 is a graph showing the dependence of ΔPFA on the substrate orientation when the normalized thickness of the ZnO film is about 0.20λ.
Figure 19:
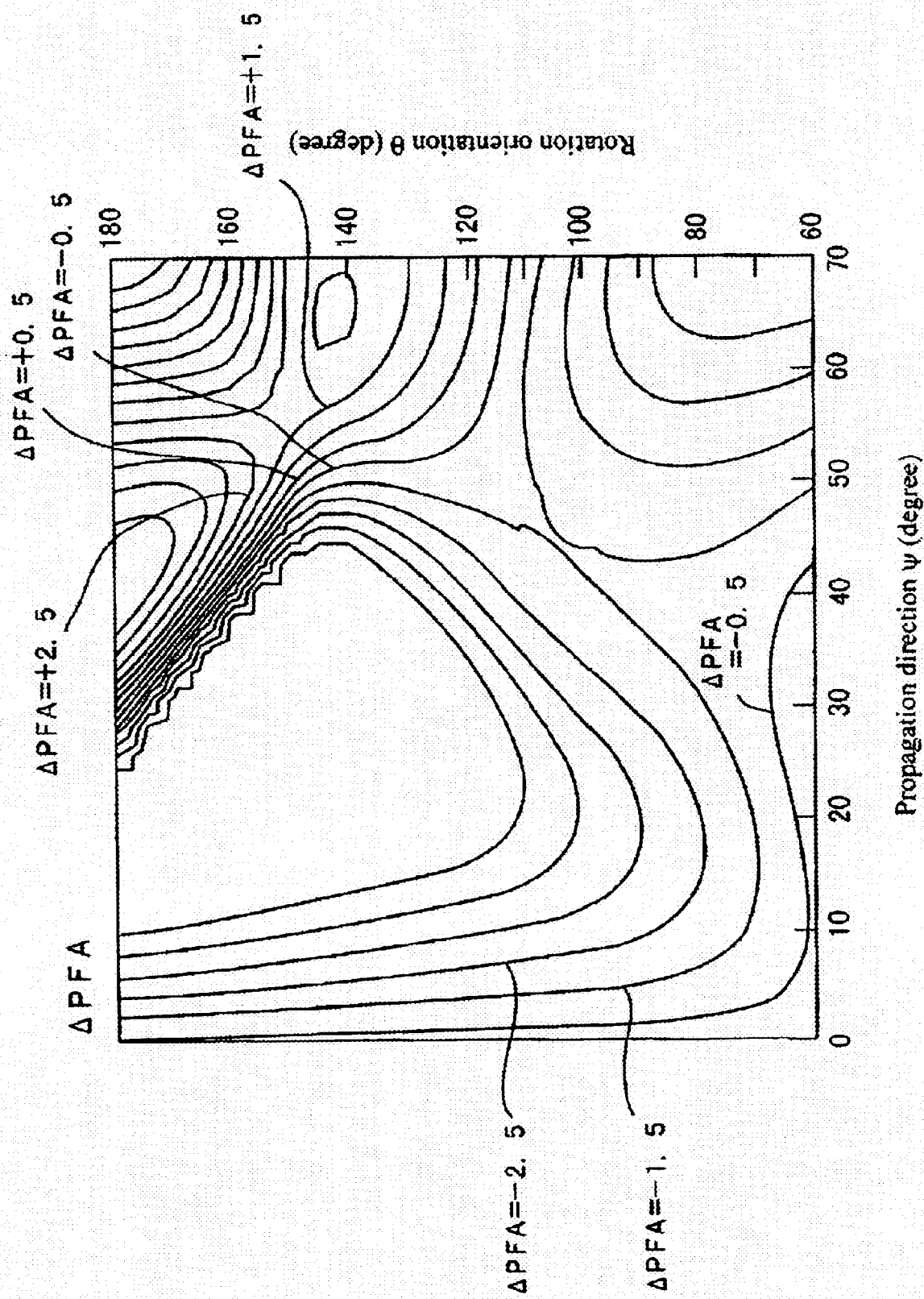
FIG. 19 is a graph showing the dependence of ΔPFA on the substrate orientation when the normalized thickness of the ZnO film is about 0.25λ.
Figure 20:
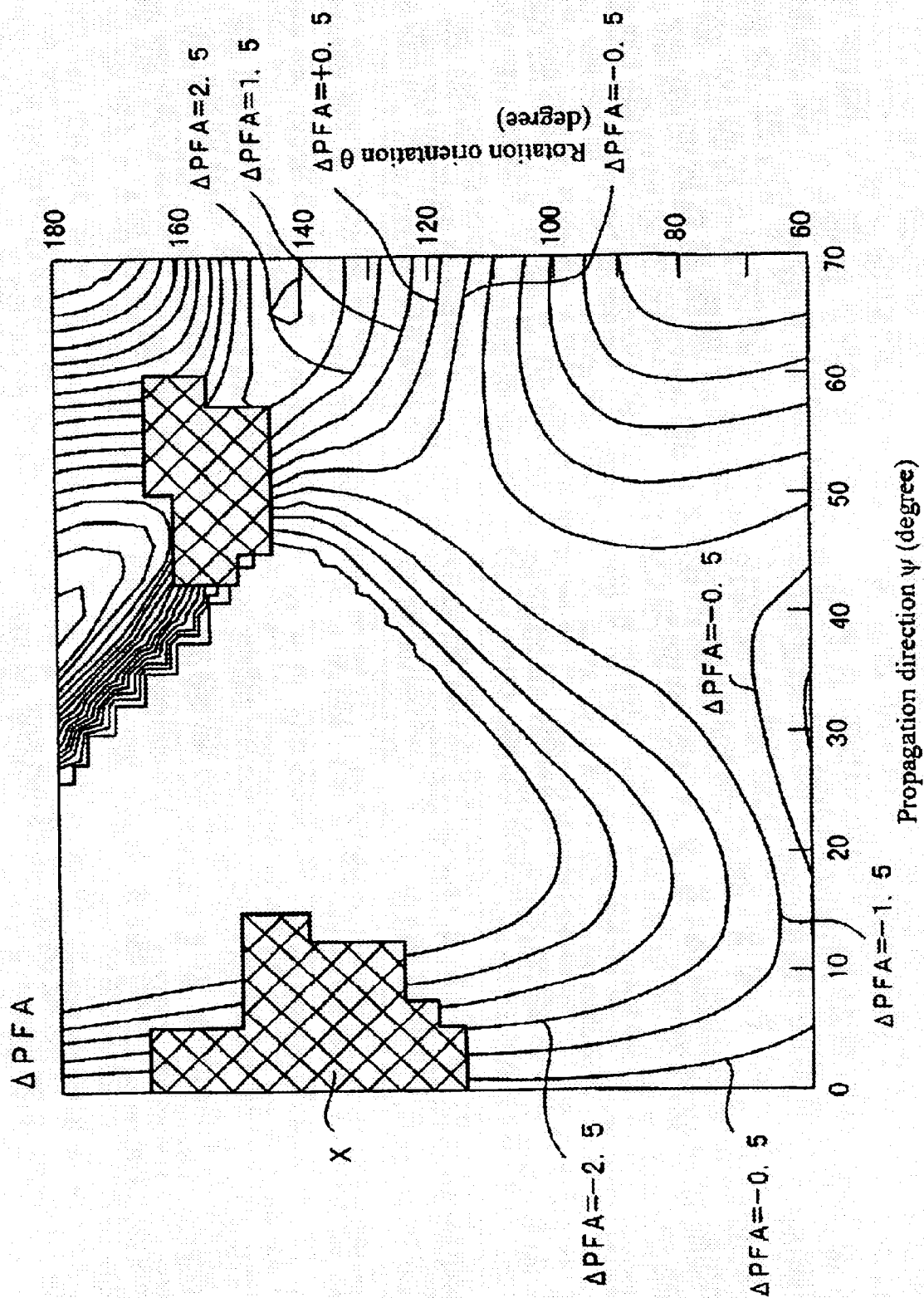
FIG. 20 is a graph showing the dependence of ΔPFA on the substrate orientation when the normalized thickness of the ZnO film is about 0.30λ.

FIGS. 18 through 20 are graphs depicting the dependence of ΔPFA on the substrate. As in the case with FIGS. 6 through 17, FIGS. 18 through 20 indicate the substrate dependence of ΔPFA when the ZnO film thicknesses are approximately 0.20λ, 0.25λ, and 0.30λ, respectively, in a SAW device having the ZnO/Al/quartz substrate structure. The contour lines in FIGS. 18 through 20 indicate that the values of ΔPFA are the same, and it is seen from FIGS. 18 through 20 that the condition in which ΔPFA is ±1° or greater is the lines P in FIG. 18.

Figure 27:
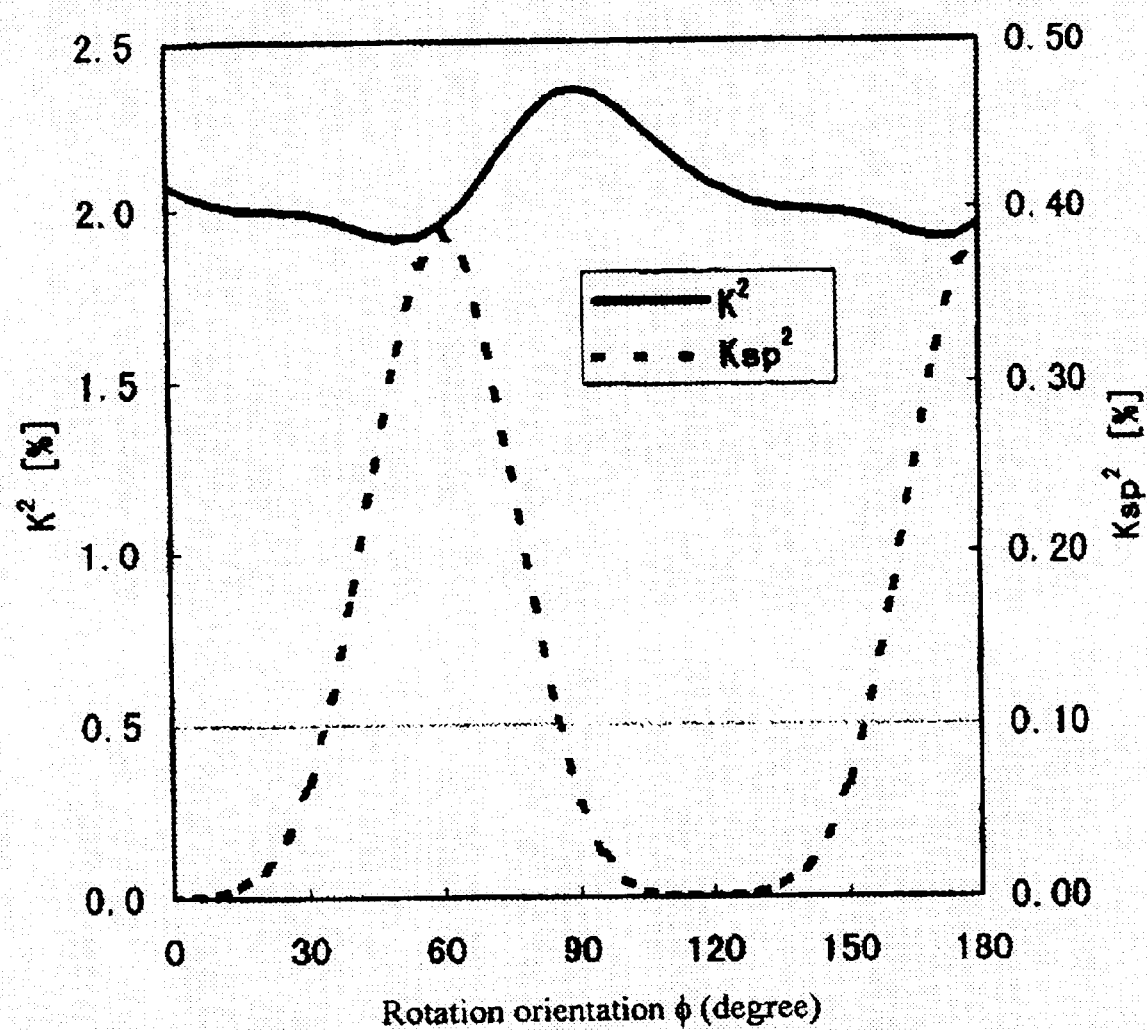
FIG. 27 is a graph showing the dependence of the electromechanical coupling coefficient $K^2$ of the Rayleigh wave and the electromechanical coupling coefficient $K_{sp}^2$ of the spurious wave on the substrate orientation φ in cases where the normalized film thickness of ZnO is 0.3λ, and the Euler angles are (φ, 117°, 0°).

FIG. 27 shows the dependence of the electromechanical coupling coefficient $K^2$ of the Rayleigh wave and the electromechanical coupling coefficient $K_{sp}^2$ of the spurious wave on the substrate orientation φ in cases where the normalized thickness of the ZnO film is 0.3λ, and the Euler angles are (φ, 117°, 0°). It is apparent from FIG. 27 that the condition in which the electromechanical coupling coefficient $K_{sp}^2$ of the spurious wave is as small as 0 to 0.1% is obtained when φ is in the ranges of −35° to +35° and +85° to +155°.

A basic principle of various preferred embodiments of the present invention is that by forming a piezoelectric thin film that has a negative value of the temperature characteristic of frequency (TCF) on a quartz substrate with a cut angle and propagation direction which are such that the TCF has a positive value as described in Reference 1 mentioned above, the temperature characteristics of the quartz substrate and the temperature characteristics of the piezoelectric thin film are cancelled by each other, thereby obtaining a favorable temperature characteristic frequency. Accordingly, it is preferable that a film having the TCF of a negative value be used as the above-mentioned piezoelectric thin film.

Furthermore, the case of forming a ZnO thin film as the piezoelectric thin film is described in the above-mentioned preferred embodiments. However, besides the ZnO thin film, it is also be possible to use a piezoelectric thin film whose TCF is positive, such as a piezoelectric thin film composed of AlN, $Ta_2O_5$, or CdS.

Moreover, the side of a quartz substrate on which a piezoelectric thin film is laminated may be either positive or negative.

In addition, it should be noted that although a surface acoustic wave in the case of forming a piezoelectric thin film on a quartz substrate may contain a displacement component that is slightly displaced in the SH direction, for the sake of convenience, the term "Rayleigh wave" in the specification of the present application includes a surface acoustic wave in which the Rayleigh wave is thus modified.

Furthermore, the calculation values indicated in the present application are calculated values under the conditions in which the density of the ZnO thin film is favorable. It should be pointed out that calculated values when the density of the ZnO film is low become close to calculated values when the ZnO film thickness is small.

In the surface acoustic wave device of various preferred embodiments of the present invention, a piezoelectric thin film is formed on a quartz substrate in which the Euler angles ($\phi$, $\theta$, $\psi$) are within the above-mentioned specific ranges, comb electrodes are arranged so as to contact this piezoelectric thin film, and the normalized thickness H/$\lambda$ of the piezoelectric thin film is at least about 0.05. As a result, accordingly, a surface acoustic wave device can be provided in which the electromechanical coupling coefficient of a spurious wave is small, so that spurious vibration can be effectively suppressed, and the electromechanical coupling coefficient $K^2$ of the Rayleigh wave is large.

Furthermore, in various preferred embodiments of the present invention, especially when the Euler angles of the quartz substrate are such that $\phi$ is in the range of $-2.5°\pm5°$, $\theta$ is in the range of $116°\pm5°$, and $\psi$ is in the range of $+2.5\pm5°$, the electromechanical coupling coefficient of the spurious wave can be kept down to about 0.005% or less, so that spurious vibration can be suppressed even more effectively.

When the normalized thickness H/$\lambda$ of the piezoelectric thin film is at least about 0.20, in particular, the electromechanical coupling coefficient $K^2$ of the Rayleigh wave can be further increased.

In cases where a piezoelectric thin film contacts a quartz substrate and/or comb electrodes on the negative side of the piezoelectric thin film, i.e., by constructing the device so that the positive side of the piezoelectric thin film is on the upper surface, the electromechanical coupling coefficient $K^2$ can be further increased.

Furthermore, a short-circuiting electrode may also be provided on the piezoelectric thin film, and a surface acoustic wave device in which the electromechanical coupling coefficient $K^2$ is large can be constructed according to preferred embodiments of the present invention in this case as well.

Moreover, when the Euler angles of the quartz substrate are in the range surrounded by the lines Y1 and Y2 in FIG. 6, the power flow angle can be set at about ±2.5°.

When the Euler angles of the quartz substrate are in the range enclosed by the lines T1 and T2 in FIG. 7, the temperature coefficients of frequency (TCF) of the surface acoustic wave device can be about ±25 ppm/° C., so that a surface acoustic wave device with a little temperature dependence can be provided. When the Euler angles of the quartz substrate are in the range enclosed by the lines T3 and T4 in FIG. 7, in particular, the temperature coefficients of frequency (TCF) of the surface acoustic wave device can be about ±5 ppm/° C.

Moreover, when the Euler angles of the quartz substrate are in the range surrounded by the lines K in FIG. 8, the electromechanical coupling coefficient $K^2$ of the Rayleigh wave can be about 0.8% or larger.

In cases where the temperature coefficient of frequency (TCF) of the piezoelectric thin film has a negative value, this coefficient is cancelled with the temperature coefficient of frequency of the quartz substrate, so that a surface acoustic wave device with little temperature dependence can easily be constructed.

When the Euler angles of the quartz substrate are in the range surrounded by the lines P in FIG. 18, the difference between the power flow angles ΔPFA of the surface acoustic wave to be utilized and the unnecessary surface acoustic wave is in the range of about ±1°, so that a surface acoustic wave device having superior characteristics can be provided. In particular, when the distance $L_{11}$ between adjacent IDTs is such that $L_{11}$>W/tan (ΔPFA) where W indicates the electrode finger crossing width of the IDTs, the effect of the unnecessary surface acoustic wave can be suppressed more effectively.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A surface acoustic wave device comprising:

a quartz substrate having Euler angles ($\phi$, $\theta$, $\psi$) such that $-19°<\phi<+15°$, $107°<\theta<125°$, and $-10°<\psi<15°$;

a piezoelectric thin film disposed on said quartz substrate; and comb electrodes arranged so as to contact said piezoelectric thin film;

wherein the normalized thickness H/$\lambda$ of the piezoelectric thin film is at least about 0.05, where the thickness of said piezoelectric thin film is H, and the wavelength of the surface acoustic wave is $\lambda$.

2. The surface acoustic wave device claimed in claim 1, wherein the Euler angles ($\phi$, $\theta$, $\psi$) of said quartz substrate are such that $\phi$ is in the range of about $-2.5°\pm5°$, $\theta$ is in the range of about $116°\pm5°$, and $\psi$ is in the range of about $2.5°\pm5°$.

3. The surface acoustic wave device claimed in claim 1, wherein the normalized thickness H/$\lambda$ of the piezoelectric thin film is at least about 0.20.

4. The surface acoustic wave device claimed in claim 1, wherein said piezoelectric thin film contacts at least one of said substrate and said comb electrodes on the negative side of the piezoelectric thin film.

5. The surface acoustic wave device claimed in claim 1, wherein a short-circuiting electrode is disposed on said piezoelectric thin film.

6. The surface acoustic wave device claimed in claim 1, wherein the Euler angles of said quartz substrate are such that the power flow angle of a Rayleigh wave is in the range of about ±2.5°.

7. The surface acoustic wave device claimed in claim 1, wherein the Euler angles of said quartz substrate are such that the temperature coefficient of frequency of the surface acoustic wave device is in the range of about ±25 ppm/° C.

8. The surface acoustic wave device claimed in claim 1, wherein the Euler angles of said quartz substrate are such that the temperature coefficient of frequency of the surface acoustic wave device is in the range of ±5 ppm/° C.

9. The surface acoustic wave device claimed in claim 1, wherein the Euler angles of said quartz substrate are such that the electromechanical coupling coefficient $K^2$ of a Rayleigh wave is about 0.8% or larger.

10. The surface acoustic wave device claimed in claim 1, wherein the temperature coefficient of frequency of said piezoelectric thin film has a negative value.

11. The surface acoustic wave device claimed in claim 1, wherein the Euler angles of said quartz substrate are such that the difference of the power flow angles between utilized surface acoustic waves and unnecessary surface acoustic waves is in the range of about ±1°.

12. The surface acoustic wave device claimed in claim 1, wherein $\phi$ of the Euler angles ($\phi$, $\theta$, $\psi$) of said quartz substrate is about −35 to +35°.

13. The surface acoustic wave device claimed in claim 1, wherein said piezoelectric thin film is composed of one type of material selected from the group consisting of ZnO, AlN, $Ta_2O_5$, and CdS.

* * * * *